United States Patent
Shah et al.

(10) Patent No.: US 8,884,240 B1
(45) Date of Patent: Nov. 11, 2014

(54) POSITION SENSITIVE SOLID-STATE PHOTOMULTIPLIERS, SYSTEMS AND METHODS

(75) Inventors: Kanai S. Shah, Newton, MA (US); James Christian, Waltham, MA (US); Christopher Stapels, Millis, MA (US); Purushottam Dokhale, Waltham, MA (US); Mickel McClish, Salem, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 1031 days.

(21) Appl. No.: 12/580,172

(22) Filed: Oct. 15, 2009

Related U.S. Application Data

(60) Provisional application No. 61/185,169, filed on Jun. 8, 2009.

(51) Int. Cl.
*H01L 31/05* (2014.01)
*G01T 1/20* (2006.01)
*G01T 1/161* (2006.01)

(52) U.S. Cl.
USPC .......... 250/370.14; 250/370.11; 250/363.05

(58) Field of Classification Search
USPC ................... 250/363.05, 370.11, 370.14
See application file for complete search history.

(56) References Cited

U.S. PATENT DOCUMENTS

| | | |
|---|---|---|
| 2008/0214927 A1 | 9/2008 | Cherry et al. |
| 2009/0093710 A1* | 4/2009 | Levin et al. ............ 600/411 |

OTHER PUBLICATIONS

Stapels et al. Solid-State Photomultiplier in CMOS Technology for Gamma-Ray Detection and Imaging Applications, 2005 IEEE Nuclear Science Symposium Conference Record, vol. 5 (Oct. 2005), pp. 2775-2779.*
Anger, "Sensitivity, resolution, and linearity of the scintillation camera," *IEEE Trans. Nucl. Sci.* 13(3):380-392 (1966).
Aprile et al., "Detection of liquid xenon scintillation light with a silicon photomultiplier," *Nucl. Instr. and Meth. in Phys. Res.* A 556:215-218 (2006).
Biland et al., "First detection of Cherenkov light from cosmic-particle-induced air showers by Geiger-mode avalanche photodiodes," *Nucl. Instr. and Meth. in Phys. Res. A* 581:143-146 (2007).
Buzhan et al., "An advanced study of silicon photomultiplier," *ICFA Instr. Bulletn* 21:28-41 (2001).
Dokhale et al., "Performance measurements of CMOS SSPM as PET Detector," *IEEE Nucl. Sci. Symp. Conf. Rec.* M14-6, pp. 3224-3228 (2007).
McClish et al., "Characterization and scintillation studies of a solid-state photomultiplier," *Nucl. Inst. and Meth. in Phys. Res.* A 572:1065-1070 (2007).

(Continued)

*Primary Examiner* — David Porta
*Assistant Examiner* — Shun Lee
(74) *Attorney, Agent, or Firm* — Wolf, Greenfield & Sacks, P.C.

(57) ABSTRACT

An integrated silicon solid state photomultiplier (SSPM) device includes a pixel unit including an array of more than 2×2 p-n photodiodes on a common substrate, a signal division network electrically connected to each photodiode, where the signal division network includes four output connections, a signal output measurement unit, a processing unit configured to identify the photodiode generating a signal or a center of mass of photodiodes generating a signal, and a global receiving unit.

10 Claims, 19 Drawing Sheets

(56) References Cited

OTHER PUBLICATIONS

Moehrs et al., "A detector head design for small animal PET with silicon photomultipliers (SiPM)," *Phys. Med. Biol.* 51:1113-1127 (2006).

MOSIS Integrated Circuit Fabrication Service. [retrieved on Oct. 28, 2010]. Retrieved from the internet <URL: www.mosis.com>.

Otte et al., "A test of silicon photomultipliers as readout for PET," *Nucl. Instr. and Meth. in Phys. Res. A* 545:705-715 (2005).

Otte et al., "The potential of SiPM as photon detector in astroparticle physics experiments like MAGIC and EUSO," *Nucl. Phys. B* (Proc. Suppl.) 150:144-149 (2006).

Otte et al., "The silicon photomultiplier—a new device for high energy physics, astroparticle physics, industrial, and medical applications," *Proceedings of SNIC Symposium*, Stanford, California, Apr. 3-6, 2006.

Otte et al., "The SiPM—A new photon detector for PET," *Nucl. Phys. B. (Proc. Suppl.)* 150:417-420 (2006).

Sefkow et al., "The CALICE tile hadron calorimeter prototype with SiPM read-out: design, construction and first test beam results," *IEEE Nucl. Sci. Symp. Conf.* 1:259-263 (2007).

Shah et al., "Position-sensitive avalanche photodiode for gamma-ray imaging," *IEEE Trans. Nucl. Sci.* 49:1687-1692 (2002).

Stapels et al., "CMOS Solid-state photomultiplier for detecting scintillation light in harsh environments," *Proceedings of SNIC Symposium*, Stanford, California, Apr. 3-6, 2006.

Teshima et al., "Ultra high energy cosmic rays," *Proceedings of 30$^{th}$ International Cosmic Ray Conference*, Merida, Mexico (Jul. 3-11, 2007).

* cited by examiner

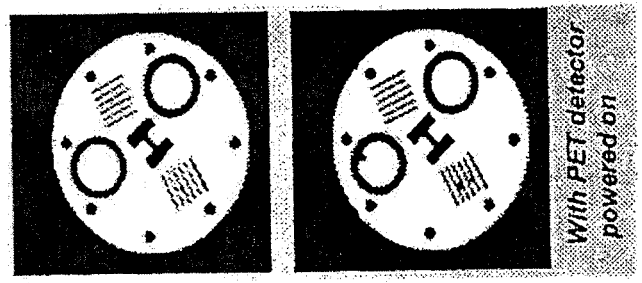
FIG. 21C With PET detector powered on
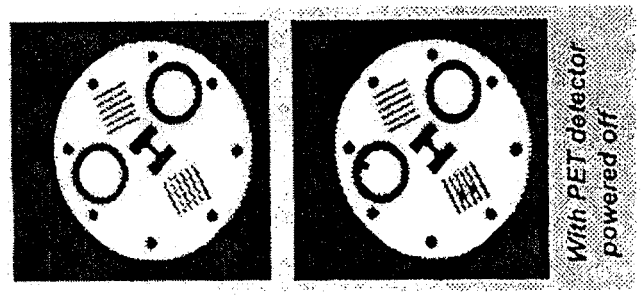
FIG. 21B With PET detector powered off
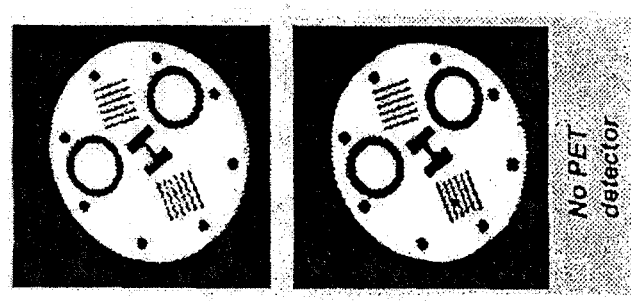
FIG. 21A No PET detector

POSITION SENSITIVE SOLID-STATE PHOTOMULTIPLIERS, SYSTEMS AND METHODS

CROSS-REFERENCE TO RELATED APPLICATION

The present invention claims the benefit of priority under 35 U.S.C. §119(e) of U.S. Provisional Application No. 61/185,169, filed Jun. 8, 2009, the entire contents of which are incorporated herein by reference.

STATEMENT REGARDING FEDERALLY SPONSORED RESEARCH OR DEVELOPMENT

This invention was made with government support under grant number DE-FG02-08ER84988 awarded by the Department of Energy and grant number 2R44NS060197-02 awarded by the Department of Health and Human Services. The government may have certain rights in this invention.

BACKGROUND OF THE INVENTION

The present invention relates to position sensitive solid-state photomultipliers, and related systems and methods. More specifically, the present invention relates to integrated silicon solid-state photomultipliers and complementary metal-oxide semiconductor (CMOS) avalanche photodiodes (APDs) operable in a Geiger mode.

Photomultiplier tubes (PMTs) have been playing an important role as photodetectors for the last several decades. PMTs, however, are relatively expensive, bulky, have relatively low quantum efficiency, come in specific fixed sizes, and are incompatible with magnetic fields, the latter issue being relevant to the growing interest in combined positron emission tomography (PET)/magnetic resonance imaging (MRI) systems. PIN photodiodes and APDs, which are compact, solid-state detectors, have previously been used to build PET detectors. However, they have demanding operating requirements, low gain, and poor timing capabilities.

Silicon solid state photomultipliers (SSPMs) are a promising photodetection technology of increased recent interest. SSPM technology is of interest for possible implementation in a wide variety of applications, including PET, astroparticle physics and gamma-ray astrophysics, high energy collider experiments, and dark matter detection experiments. However, existing SSPM technologies suffer from relatively high cost and complicated implementations, as well as other deficiencies.

Accordingly, a need exists for SSPMs, and related devices, systems, and methods, as well as SSPMs for use in various radiation detection applications, including medical imaging applications.

BRIEF SUMMARY OF THE INVENTION

The present invention provides integrated silicon solid state photomultiplier (SSPM) devices as well as related radiation detection devices and imaging systems.

In one embodiment, an integrated silicon SSPM device is operable in a Geiger mode. The SSPM device comprises a pixel unit including an array of more than 2×2 p-n micro-pixels on a planar substrate; a signal division network electrically coupled to each micro-pixel, the signal division network including four output connections each for providing an output signal; a signal output measurement unit configured to measure the output signal from each output connection; a processing unit configured to process the output signals so as to identify the micro-pixel generating a signal or a center of mass of micro-pixels generating a signal; and a global signal receiving unit comprising a preamplifier electrically coupled in series with a capacitor, wherein the capacitor is electrically coupled to the micro-pixels.

In another embodiment, a radiation detection system is provided. The radiation detection system comprises an integrated silicon SSPM device configured for operation in a Geiger mode, and a scintillator optically coupled to the SSPM device. The SSPM device includes a pixel unit including an array of more than 2×2 p-n Geiger photodiodes (GPDs) on a common substrate; a signal division network electrically coupled to each GPD, the signal division network including four output connections each for providing an output signal; means for measuring the output signal from each output connection; means for processing the output signals so as to identify the photodiode generating a signal or a center of mass of photodiodes generating a signal; and means for obtaining a global signal In yet another embodiment, a radiation detection system comprises an array of integrated silicon SSPM devices operable in a Geiger mode, where each SSPM device comprises a plurality of pixel units, and each pixel unit comprises an array of more than 2×2 p-n GPDs on a common substrate. Here, the array of integrated SSPM devices comprises an assembly of single pixels.

In a further embodiment, a method for detecting radiation is provided. The method includes: providing a system including a pixel unit having an array of more than 2×2 p-n micro-pixels on a common substrate, wherein the system is operably coupled to a scintillator; providing an output signal to each of four output connections, wherein each output signal is generated based on signals generated from the micro-pixels; measuring the output signal from each output connection; processing the output signals so as to identify the micro-pixel generating a signal or a center of mass of micro-pixels generating a signal; obtaining a global signal from a common electrode by summing four position information signals, wherein the position information signals are based on the output signals; and outputting the global signal to reconstruct an image for display.

For a fuller understanding of the nature and advantages of the present invention, reference should be made to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

BRIEF DESCRIPTION OF THE DRAWINGS

FIG. 21A shows MRI images acquired without a PET detector.

FIG. 21B shows MRI images acquired with an inactive PET detector located in the MRI system.

FIG. 21C shows MRI images acquired with an active PET detector located in the MRI system.

DETAILED DESCRIPTION OF THE INVENTION

Figure 1:
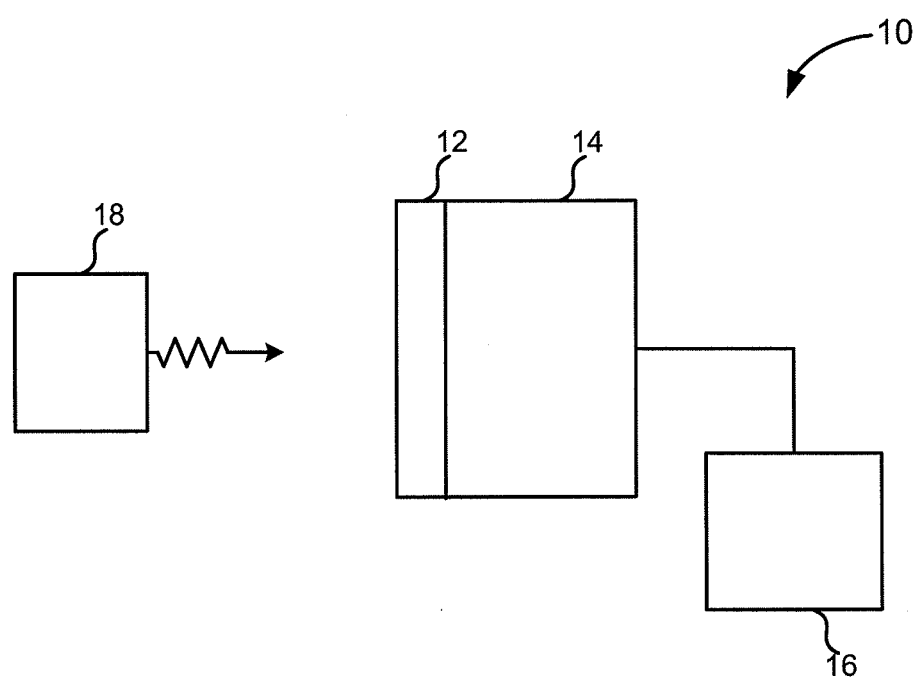
FIG. 1 is a diagram of a radiation detection assembly.

The present invention includes methods, devices, and systems including an integrated silicon solid state photomultiplier (SSPM) device.

Some terminology used in this application is defined below.

A single solid state device operable in Geiger mode is referred to as a micro-pixel or a Geiger photodiode (GPD).

An integrated device that has more than 2×2 GPDs is referred to as a solid state photomultiplier (SSPM) if there is no resistive network for imaging. Such SSPMs can provide energy and timing information but not imaging information. In some embodiments, SSPMs may have 1000×1000 GPDs with a dimension of 1×1 $mm^2$ to a few $cm^2$. A combined SSPM element is referred to as a SSPM pixel.

With a resistive network for imaging, the device is referred to as a position sensitive solid state photomultiplier (PS-SSPM), which can provide energy, timing and position information.

A monolithic or assembled array of SSPMs is called a SSPM (or PS-SSPM) array.

As described herein, the present invention includes SSPMs comprising an array of micro-pixel p-n photodiodies. In some embodiments, a size of the SSPM ranges from 20-50 μm. The photodiodes may be operated in Geiger mode using a relatively low applied bias (<60 V). In Geiger mode, a diode is operated above its breakdown threshold voltage, where a single electron-hole pair can trigger a strong avalanche. In the case of such an event, electronics may operate to reduce the voltage at the diode below the threshold voltage for a short time, so that the avalanche is stopped. The photodiode will then be operable once again to detect further photons. Photodiodes operated in Geiger mode advantageously increase a gain of a diode. For example, Geiger photodiodes may provide a gain in a range of $10^5$ to $10^6$.

Each micro-pixel in the array may operate independently, producing the same high gain output for a given micro-pixel capacitance and bias, regardless of the number of incident photons due to the Geiger mode operation. The micro-pixels in the array may share a planar substrate. Accordingly, the outputs from all of the micro-pixels, which may number as much as, e.g., $10^3/mm^2$, are summed together to produce a single macro SSPM analog output. Energy information may be available where although each micro-pixel provides a fixed signal independent of the number of photons reaching it during its on-time, if the micro-pixel density is high enough, then on average, each micro-pixel is triggered by a single photon, and the number of micro-pixels producing a signal becomes an indication of the total number of photons in a light pulse.

As further described herein, SSPM technology has been developed using a complementary metal-oxide-semiconductor (CMOS) process. This approach is attractive since it allows high precision SSPM mass production at a low cost, and additionally offers the possibility to integrate signal processing electronics with the SSPM. As further described herein, discrete CMOS SSPMs, as well as 4×4 SSPM arrays, have been developed. Configured as an array, the SSPM outputs may all be connected to resistive networks providing position sensitive information on the micro-pixel level while requiring only a limited number (e.g., four) of readout channels to generate an image. These devices may not only indicate where light is incident upon the SSPM sensing area, but also provide spectroscopic and timing information as needed.

The SSPM technology described herein may be incorporated into a variety of systems and devices. For example, the SSPM technology described herein may be used in the detection and spectroscopy of energetic photons (e.g., X-rays, gamma-rays, etc.). Such detectors are commonly used, for example, in nuclear and particle physics research, medical imaging, diffraction, non destructive testing, nuclear treaty verification and safeguards, nuclear non-proliferation monitoring, and geological exploration. The SSPM technology may also be used in, for example, single photon emission computed tomography (SPECT) imaging systems, x-ray computed tomography scanner systems, positron emission tomography (PET) systems, and combined PET/MRI systems.

FIG. 1 is a schematic diagram of a detector assembly 10. The detector assembly 10 includes a scintillator 12 optically coupled to a light photodetector/imaging device 14. The detector assembly 10 may also include a data analysis/computer control system 16 to process information from the scintillator 12 and light photodetector 14. The computer control system 16 may be separate from the light photodetector 14 as illustrated in FIG. 1. Alternatively, the computer control system 16 and the light photodetector 14 may comprise a single unit. In use, the detector assembly 10 detects energetic radiation emitted from a source 18. The detector assembly 10 can be included, in whole or in part, in detector and imaging systems, e.g., as described further below.

The data analysis/computer control system 16 can include, for example, a module or system to process information (e.g., radiation detection information) from the photodetector 14. The module or system can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The scintillator 12 may comprise structures and compositions as described in, e.g., U.S. Pat. No. 7,129,494, U.S. Pat. No. 7,405,404, U.S. Pat. No. 7,365,333, U.S. Pat. No. 7,405,406, U.S. Pat. No. 7,375,341, U.S. Pat. No. 7,361,901, U.S. patent application Ser. No. 11/535,797, U.S. patent application Ser. No. 11/754,208, U.S. patent application Ser. No. 11/843,881, U.S. patent application Ser. No. 11/773,356, U.S. patent application Ser. No. 11/938,172, U.S. patent application Ser. No. 11/894,484, U.S. patent application Ser. No. 12/334,351, U.S. patent application Ser. No. 11/938,176, U.S. patent application Ser. No. 12/405,168, U.S. patent application Ser. No. 12/490,955, U.S. patent application Ser. No. 12/497,436, U.S. Patent Application No. 61/230,970, all of which are incorporated by reference herein in their entirety. For example, the scintillator 12 may comprise a doped strontrium iodide, where the dopant comprises europium, cerium, or thallium. The scintillator 12 may comprise a crystalline, ceramic, or polycrystalline ceramic form. The scintillator 12 may comprise a plurality of elements such as scintillation crystals that luminesce when excited by ionizing radiation. The scintillator 12 may be a pixellated microcolumnar scintillator. The scintillator 12 may be substantially continuous.

The detector assembly 10, which can include the scintillator 12 and the photodetector 14, can be connected to a variety of tools and devices, as mentioned previously. Various technologies for operably coupling or integrating a radiation detector assembly containing a scintillator to a detection device can be utilized in the present invention, including various known techniques. The detectors may also be connected to a visualization interface, imaging equipment, or digital imaging equipment (e.g., pixilated flat panel devices).

The detector assembly 10 may include means for permitting radiation-induced scintillation light to pass out of the scintillator 12 for measurement by the photodetector/imaging device 14. For example, the detector assembly 10 may include an optical window at an end of a casing enclosing the scintillator 12, where the end of the casing faces the photodetector/imaging device 14. The window thus permits radiation-induced scintillation light to pass out of the scintillator 12 for measurement by the photodetector/imaging device 14, which is coupled to the scintillator 12. The photodetector/imaging device 14 converts the light photons emitted from the scintillator 12 into electrical pulses that may be shaped and digitized by, for example, the associated electronics. By this general process, radiation such as gamma-rays can be detected.

Figure 2:
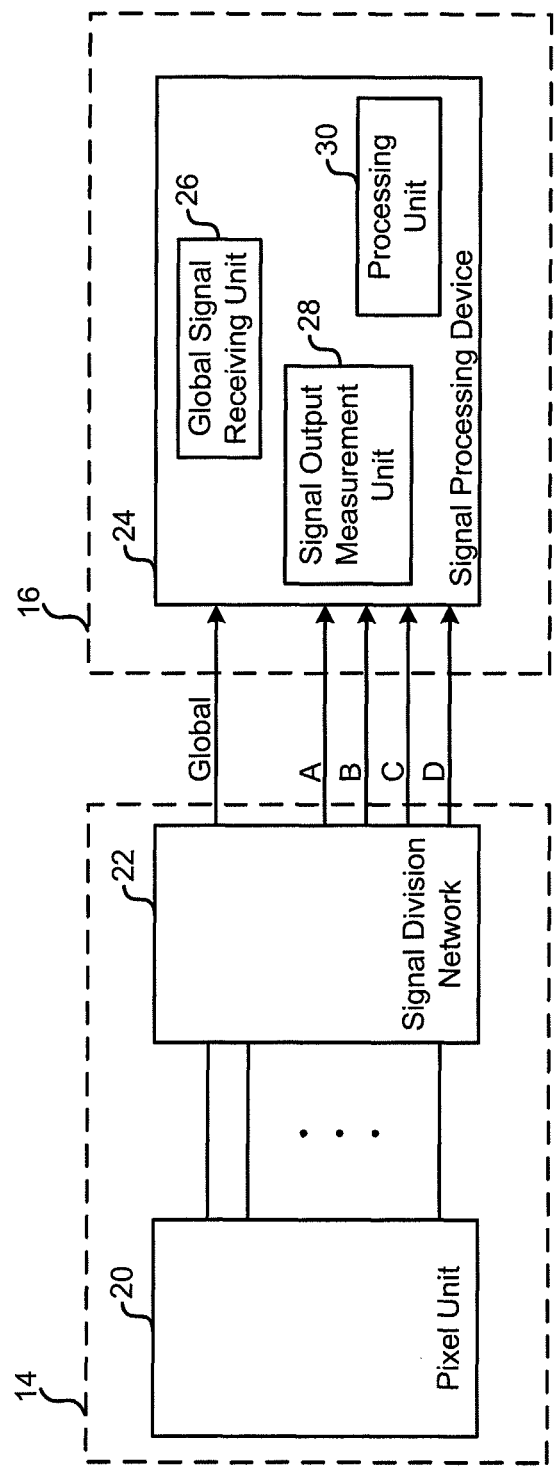
FIG. 2 is a diagram of a photodetector/imaging device and a data analysis/computer control system.

FIG. 2 illustrates a photodetector/imaging device 14 and a data analysis/computer control system 16 according to an embodiment. The photodetector 14 includes a pixel unit 20 comprising a plurality of micro-pixels or GPDs. Each pixel may comprise a light detecting element such as a GPD. Each GPD may range in size from 20 to 40 μm. The plurality of GPDs may be arranged in a single array or into a plurality of arrays, and may be provided at a density of around $10^3/mm^2$. For example, 2×2 arrays, 4×4 arrays, 6×6 arrays, and the like may be provided. Arrays having a size greater than 6×6 may also be provided. The photodiodes may all share a common substrate, and may be p-n photodiodes formed using a 0.8 μm CMOS process. Each photodiode may be operated in Geiger mode using a relatively low applied bias (e.g., <60 V), and may operate independently to produce a high gain (e.g., $10^5$ to $10^6$) output.

The photodetector/imaging device 14 need not be limited to p-n photodiodes formed using a 0.8 μm CMOS process, in a size from 20 to 50 μm, and provided at a density of around $10^3/mm^2$, and operated in Geiger mode using a relatively low applied bias. Rather, other types of photodiodes may be used. For example, PIN photodiodes may be used. Other types of fabrication processes may be used as known in the art. The size of the photodiodes may be less than 20 μm and greater than 50 μm. The photodiodes may be provided at a density less than or greater than $10^3/mm^2$. The photodiodes may be operated in other modes, such as photovoltaic mode and photoconductive mode.

The photodetector 14 also includes a signal division network 22, where an electrical connection is provided between the signal division network 22 and each of the photodiodes in the pixel unit 20. The signal division network 22 is electrically coupled to the pixel unit 20 such that electric currents provided by each photodiode are distributed over the signal division network 22. The signal division network 22 may use passive quenching to terminate Geiger discharges from the photodiodes of the pixel unit 20, where the passive quenching may be facilitated via resistive elements provided in the signal division network 22. As a result, the signal division network may be a resistive network. In other embodiments, the signal division network may be a capacitive network and/or an inductive network. In some embodiments, active quenching elements may also be used.

The signal division network 22 provides a plurality of signals, such as signals A, B, C, and D, for measuring electric currents provided by the pixel unit 20. The signal division network 22 includes output connections for each of the plurality of signals, where each output connection provides one of the plurality of signals. For example, four output connections may be provided, where each output connection outputs one of the signals A, B, C, and D. The signals A, B, C, and D may have current amplitudes that are proportional to a location of an activated/firing photodiode or proportional to a center of mass of activated/firing photodiodes. The signal division network 22 may also provide a global signal for communicating energy and timing information such as energy and timing resolution.

The data analysis/computer control system 16 includes a signal processing device 24 for receiving the plurality of signals from the signal division network 22, such as signals A, B, C, D, and Global, and for performing signal processing on the received signals. The signal processing device 24 includes a global signal receiving unit 26, a signal output measurement unit 28, and a processing unit 30. The global signal receiving unit 26 receives the global signal from a common electrode in the signal division network 22. The global signal receiving unit 26 may include an AC coupled charge sensing preamplifier for receiving the global signal. The global signal is approximately equal to the sum of the other signals, such as A, B, C, and D, provided by the signal division network 22.

The signal processing device 24 also includes a signal output measurement unit 28 for measuring the output signal from each output connection of the signal division network 22. For example, the signal output measurement unit 28 may measure the output signals A, B, C, and D. The signal output measurement unit 28 may include charge sensitive preamplifiers, transimpedance amplifiers and/or operational amplifiers for shaping and/or applying a gain to the output signals A, B, C, and D so as to produce conditioned output signals A', B', C', and D' from the output signals A, B, C, and D, respectively. The A, B, C, and D, and A', B', C', and D' refer to the position-sensitive outputs of different embodiments of each of the photodiodes in the pixel unit 20.

The signal processing device 24 further includes a processing unit 30 for processing output signals from the signal division network 22 so as to identify the photodiode generating a signal or so as to identify a center of mass of photodiodes generating a signal. In an embodiment, the output signals A, B, C, and D are processed. In another embodiment, the conditioned output signals A', B', C' and D' are processed. As previously mentioned, electric currents provided by each photodiode are distributed over the signal division network 22 and have amplitudes that are proportional to a location of an activated/firing photodiode or proportional to a center of mass of activated/firing photodiodes. Accordingly, the processing unit 30 analyzes either the output signals A, B, C, and D or the conditioned output signals A', B', C', and D' to calculate the location, such as an X and Y position, of the activated/firing photodiode or the location of a center of mass of photodiodes. For example, the processing unit 30 may include Anger logic that uses the peak amplitude from the received signals to provide spatial information on an event-by-event basis. The processing unit 30 may then generate an image or cause an image to be generated based on the calculated locations. As a result, images can be generated using a scintillator 12 optically coupled to a photodetector/imaging device 14 and a data analysis/computer control system 16.

Figure 3:
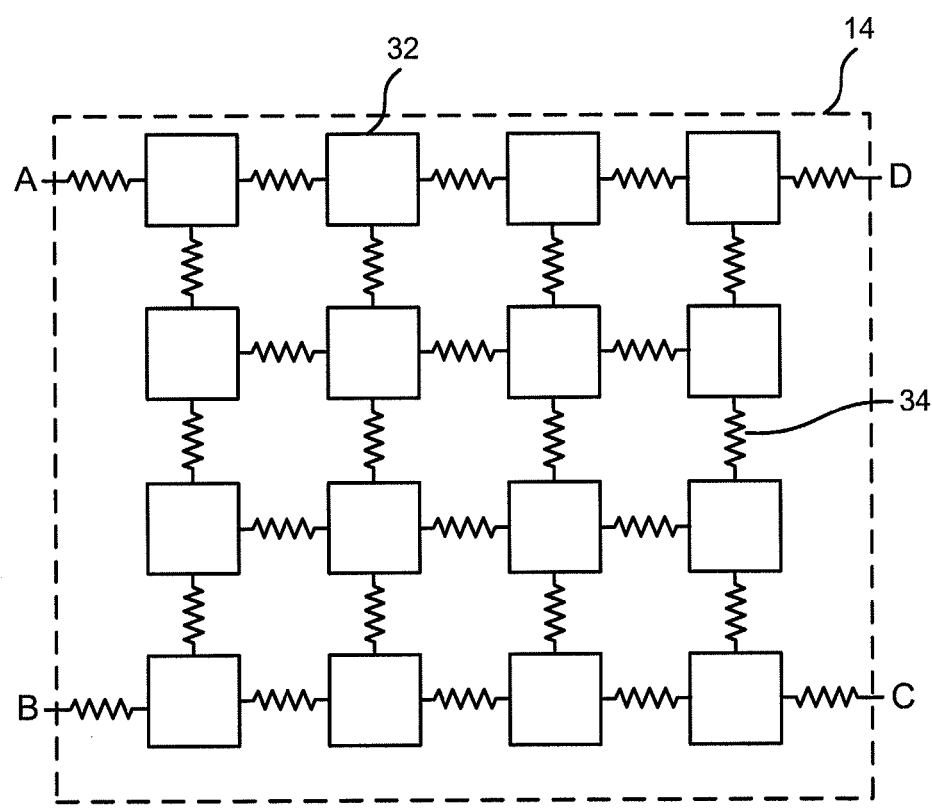
FIG. 3 illustrates a photodetector according to an embodiment.

FIG. 3 illustrates a photodetector 14 according to an embodiment. The photodetector 14 includes a pixel unit comprising a plurality of micro-pixels 32. The photodetector 14 also includes a signal division network comprising a plurality of resistive components 34. According to the embodiment illustrated in FIG. 3, sixteen micro-pixels 32 are provided. However, more or less micro-pixels 32 may be provided. Each micro-pixel 32 may comprise a photodiode operable in a Geiger mode. A resistive component 34 is provided between every pair of micro-pixels 32. For example, a resistive element 34 may be provided in series between each pair of micro-pixels 32 that are arranged in a row. A resistive element 34 may also be provided in series between each pair of micro-pixels 32 that are arranged in a column. As a result, the signal division network comprises a two-dimensional array of elements. The signal division network may also comprise two or more linear arrays of elements. In other embodiments, the signal division network may comprise non-linear arrays.

The signal division network includes four output connections, A, B, C, and D, where one output connection is provided at each corner of the signal division network. The output connections thus provide signals having current amplitudes that are proportional to a location of an activated/firing photodiode or proportional to a center of mass of activated/firing photodiodes. The signals from the output connections may then be used by the signal processing device 24 to determine the location of an activated/firing photodiode or the location of the center of mass of activated/firing photodiodes.

Figure 4A:
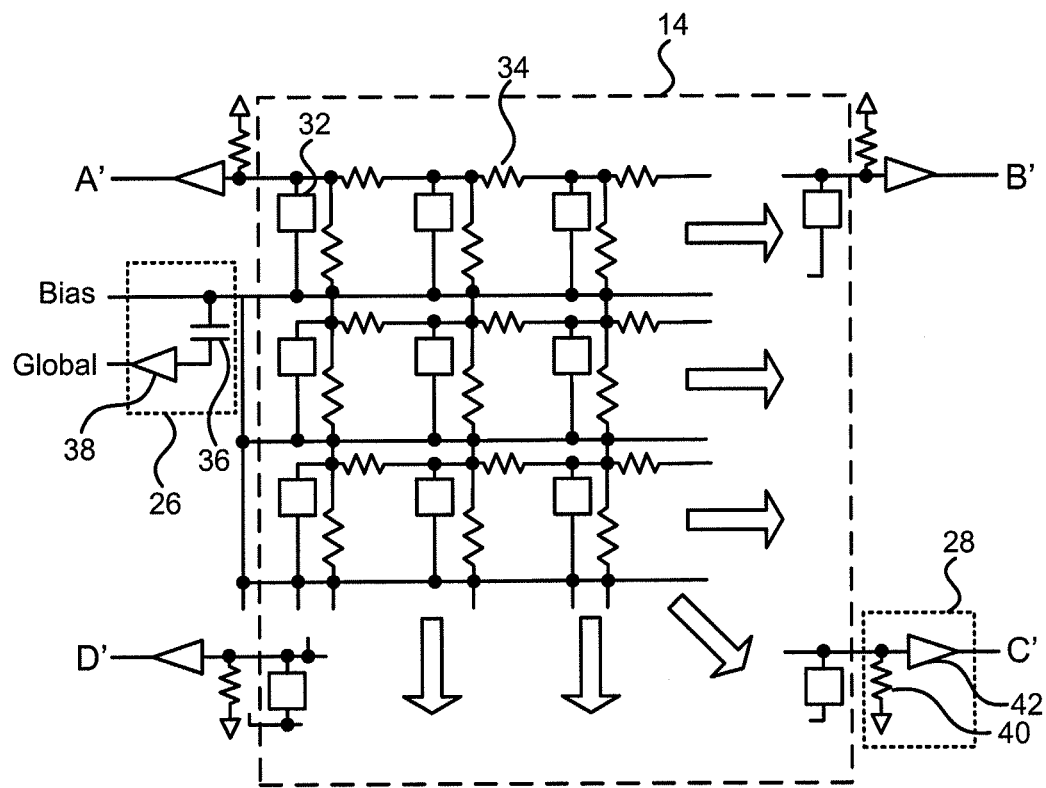
FIG. 4A illustrates a photodetector and portions of a signal processing device according to an embodiment.

FIG. 4A illustrates a photodetector 14 and portions of a signal processing device 24 according to an embodiment. The photodetector 14 includes a pixel unit comprising a plurality of micro-pixels 32. The photodetector 14 also includes a signal division network comprising a plurality of resistive elements 34. According to the embodiment illustrated in FIG. 4A, the micro-pixels 32 have two terminals. The micro-pixels 32 arranged in a row are coupled in parallel with one another and are each coupled in parallel with a resistive element 34. A resistive element 34 is also coupled in series between each pair of micro-pixels 32 that are arranged in a row. The resistive elements 34 may each comprise, for example, a 2 kΩ resistor. A bias voltage is applied to one of the terminals of each micro-pixel 32. Although the embodiment illustrated in FIG. 4A provides a 3×3 array of micro-pixels 32 and corresponding signal division network, a smaller or larger array may be provided. For example, a 2×2 array may be provided, as could a 4×4 array, 5×5 array, and the like. According to an embodiment, arrays greater than 2×2 are provided.

As illustrated in FIG. 4A, a global signal receiving unit 26 is electrically coupled to the bias voltage and includes a capacitor 36 and a preamplifier 38 arranged in series with one another. The preamplifier 38 shapes and/or applies a gain to the output of the capacitor 36 so as to provide the global signal, which can subsequently be output to the processing unit 30. The global signal receiving unit 26 is electrically coupled to the same terminal of each of the micro-pixels 32. A signal output measurement unit 28 is provided for measuring the output signal from each output connection of the signal division network. The signal output measurement unit 28 includes a pull-down resistor 40 and a preamplifier 42 for each output connection, where the preamplifier 42 shapes and/or applies a gain to the output signal at the output connection. For example, as illustrated in FIG. 4A, the signal output measurement unit 28 shapes and/or applies a gain to the output signal C so as to produce conditioned output signal C'. Although the illustration in FIG. 4A shows the signal output measurement unit 28 only corresponding to the output signal C', the signal output measurement unit 28 may also correspond to the output signals A', B', and D'. In some embodiments, the pull-down resistor 40 may be replaced with a pull-up resistor when the device is biased with a negative supply.

Figure 4B:
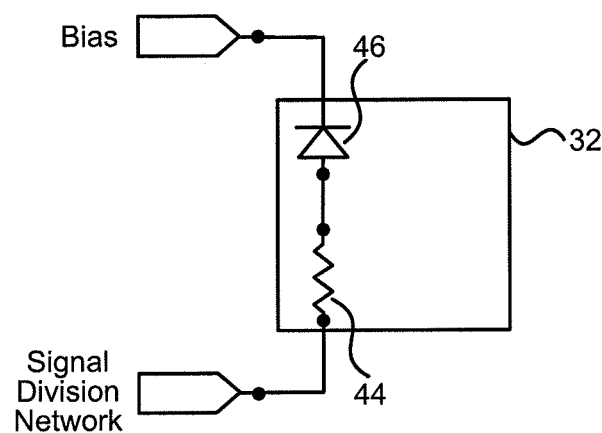
FIG. 4B illustrates a Geiger photodiode (GPD) according to an embodiment.

FIG. 4B illustrates a micro-pixel 32 according to an embodiment. The micro-pixel 32 includes a resistive element 44 arranged in series with a photodiode 46. The photodiode 46 is operable in a Geiger mode, and the resistive element 44 passively quenches, and distributes into the signal division network, the Geiger discharge from the photodiode 46. The resistive element 44 may comprise, for example, a 200 kΩ resistor.

According to the embodiments illustrated in FIG. 4A and FIG. 4B, the processing unit 30 of the signal processing device 24 may receive conditioned output signals from each of the output connections of the signal division network. For example, the processing unit 30 may receive signals A', B', C', and D'. The processing unit 30 may then calculate the X and Y position for an activated/firing photodiode in the array of micro-pixels 32 as:

$$X = \frac{(A'+B')-(C'+D')}{A'+B'+C'+D'} \quad Y = \frac{(A'+D')-(B'+C')}{A'+B'+C'+D'} \quad (1)$$

Figure 5A:
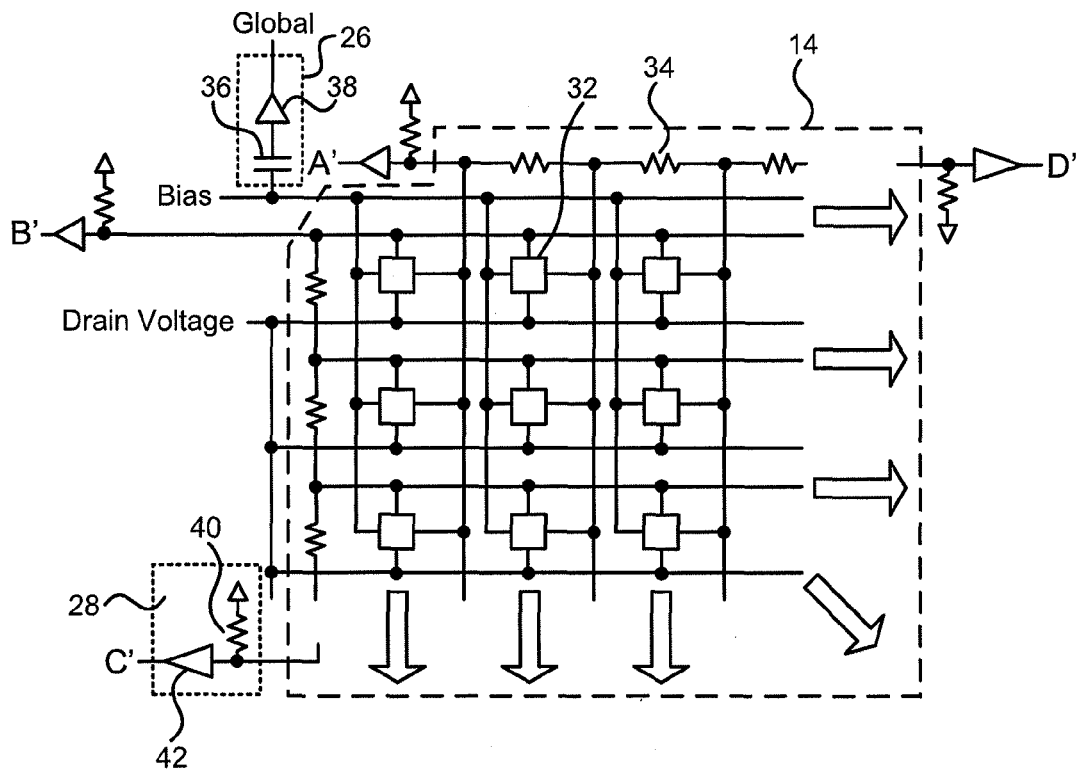
FIG. 5A illustrates a photodetector and portions of a signal processing device according to another embodiment.

FIG. 5A illustrates a photodetector 14 and portions of a signal processing device 24 according to an embodiment. The labeled elements illustrated in FIG. 5A which correspond to those illustrated in FIG. 4A are similar, and thus further description is omitted. However, in contrast with the embodiment illustrated in FIG. 4A, the embodiment illustrated in FIG. 5A includes a pixel unit comprising a plurality of micro-pixels 32 each having four terminals. Further, the micro-pixels 32 arranged in a row are coupled in parallel with one another, and the micro-pixels 32 arranged in a column are also coupled in parallel with one another. A bias voltage is applied to a first one of the terminals of each micro-pixel 32. A drain voltage is applied to a second one of the terminals of each micro-pixel 32.

The row-column readout embodiment, illustrated in FIG. 5A, maintains the orthogonality of the X and Y position signals. The signal charge is equally divided and sent to two separate charge-division networks: a charge-division network for the column location, or X coordinate, and a charge-division network for the row location, or Y coordinate. Resistive elements 34 are provided, for each row of micro-pixels 32, in series between the two row division network output connections. Similarly, resistive elements 34 are provided, for each column of micro-pixels 32, in series between the two column division network output connections.

Figure 5B:
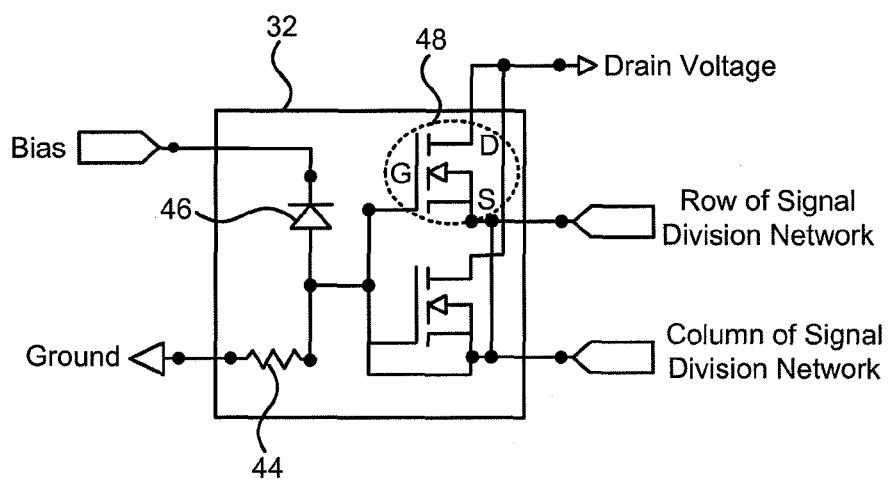
FIG. 5B illustrates a GPD according to another embodiment.

FIG. 5B illustrates a micro-pixel 32 according to an embodiment. The labeled elements illustrated in FIG. 5B which correspond to those illustrated in FIG. 4B are similar, and thus further description is omitted. However, in contrast with the embodiment illustrated in FIG. 4B, the embodiment illustrated in FIG. 5B includes a pair of field effect transistors (FETs) 48 having gates G electrically coupled between the row or column signal division network and the photodiode 46 of the micro-pixel 32. A drain voltage is applied to a drain D of each of the FETs 48. The drain voltage may be, for example, equal to +3V. A source S of one of the FETs 48 is electrically coupled to a row of the signal division network. A source S of the other FET 48 is electrically coupled to a column of the signal division network. The sources S of the FETs 48 are electrically coupled to one another and between the resistive element 44 and the photodiode 46 of the micro-pixel 32.

In this embodiment, the orthogonality of the X and Y coordinates are maintained by FET transistors located at each pixel. A charge pulse from a GPD element actives, equally, both FET transistors. Each FET transistor is coupled to a linear resistor network. One resistor network provides the column location, or X coordinate, and the second resistor network provides the row location, or Y coordinate. The role of the linear charge-division network is similar to the embodiment illustrated in FIG. 6A. The difference is that active components (e.g., two FET transistors) are used to equally divide the signal charge into the two charge-division networks, as opposed to the passive resistor component used in FIG. 6B. With the use of active components, the accuracy of the charge division does not depend on the relative values of the quenching and network resistances.

According to the embodiments illustrated in FIG. 5A and FIG. 5B, the processing unit 30 of the signal processing device 24 may receive conditioned output signals from each of the output connections of the signal division network. For example, the processing unit 30 may receive signals A', B', C', and D'. The processing unit 30 may then calculate the X and Y position for an activated/firing photodiode in the array of micro-pixels 32 as:

$$X = \frac{A'-D'}{A'+D'} \quad Y = \frac{B'-C'}{B'+C'} \quad (2)$$

Figure 6A:
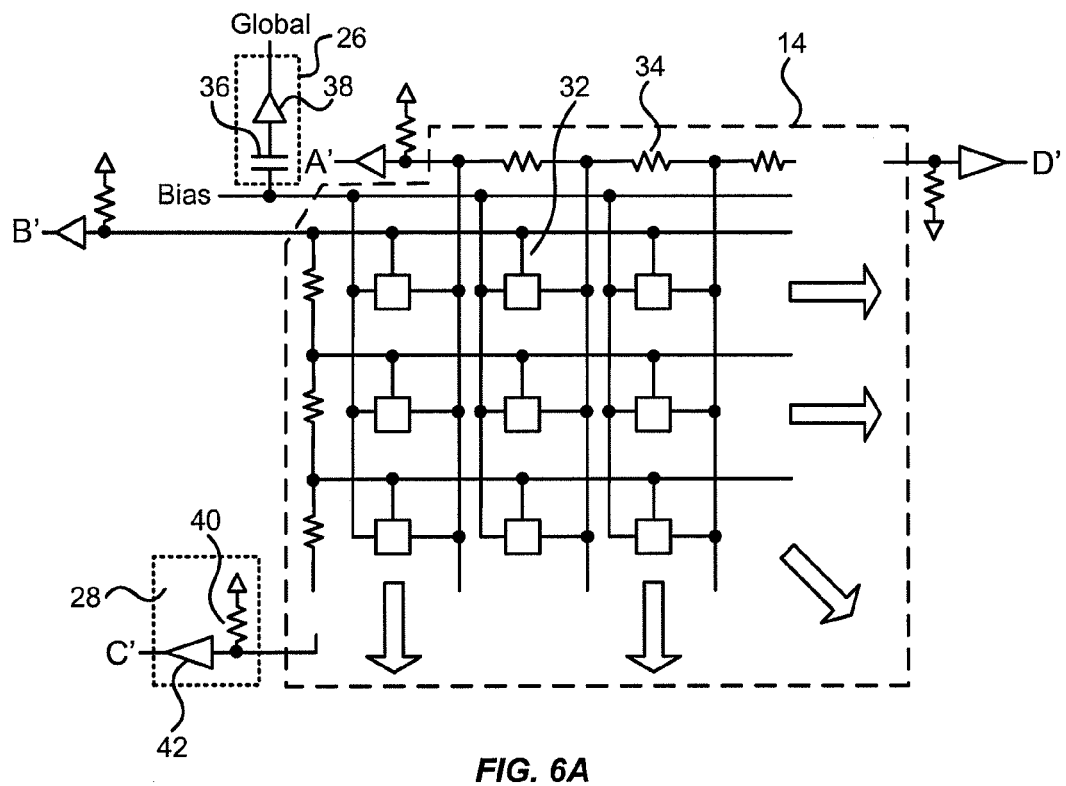
FIG. 6A illustrates a photodetector and portions of a signal processing device according to a further embodiment.

FIG. 6A illustrates a photodetector 14 and portions of a signal processing device 24 according to an embodiment. The labeled elements illustrated in FIG. 6A which correspond to those illustrated in FIG. 5A are similar, and thus further description is omitted. However, in contrast with the embodiment illustrated in FIG. 5A, the embodiment illustrated in FIG. 6A includes a pixel unit comprising a plurality of micro-pixels 32 each having three terminals, where there is no drain voltage applied to a terminal of the micro-pixels 32.

FIG. 6A shows an embodiment where passive components (e.g., resistive elements 44 in FIG. 6B) are used to equally divide the charge into the two charge-division networks. The accuracy of equally splitting the charge between the X and Y charge-division networks improves when the collective resistance of the resistive elements 44 is large relative to the total resistance of the charge division networks, defined by the resistive elements 34. The charge-division network is a linear array of resistive elements 44, that divides the charge between two contacts for each coordinate.

Figure 6B:
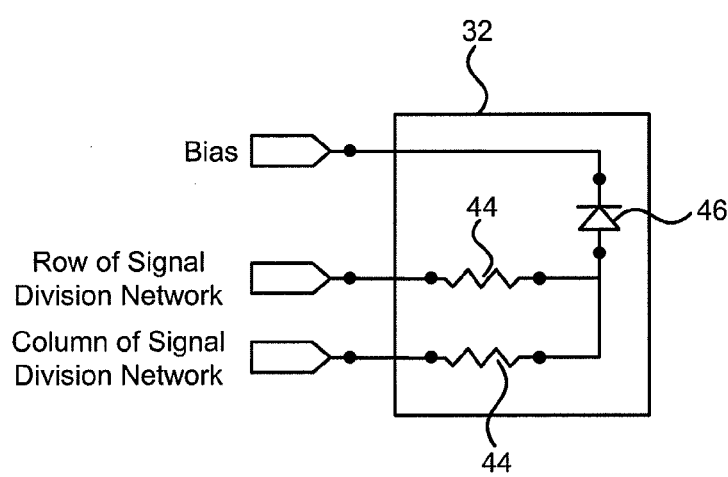
FIG. 6B illustrates a GPD according to a further embodiment.

FIG. 6B illustrates a micro-pixel 32 according to an embodiment. The labeled elements illustrated in FIG. 6B which correspond to those illustrated in FIG. 4B are similar, and thus further description is omitted. However, in contrast with the embodiment illustrated in FIG. 4B, the embodiment illustrated in FIG. 6B includes a pair of resistive elements 44. A terminal of one of the resistive elements 44 is electrically coupled to a row of the signal division network, while the other terminal of the resistive element 44 is electrically coupled to a terminal of the photodiode 46. A terminal of another one of the resistive elements 44 is electrically coupled to a column of the signal division network, while the other terminal of the resistive element 44 is electrically coupled to the terminal of the photodiode 46. A bias voltage is applied to another terminal of the photodiode 46.

According to the embodiments illustrated in FIG. 6A and FIG. 6B, the processing unit 30 of the signal processing device 24 may receive conditioned output signals from each of the output connections of the signal division network. For example, the processing unit 30 may receive signals A', B', C', and D'. The processing unit 30 may then calculate the X and Y position for an activated/firing photodiode in the array of micro-pixels 32 as described above in equation (2).

Figure 7:
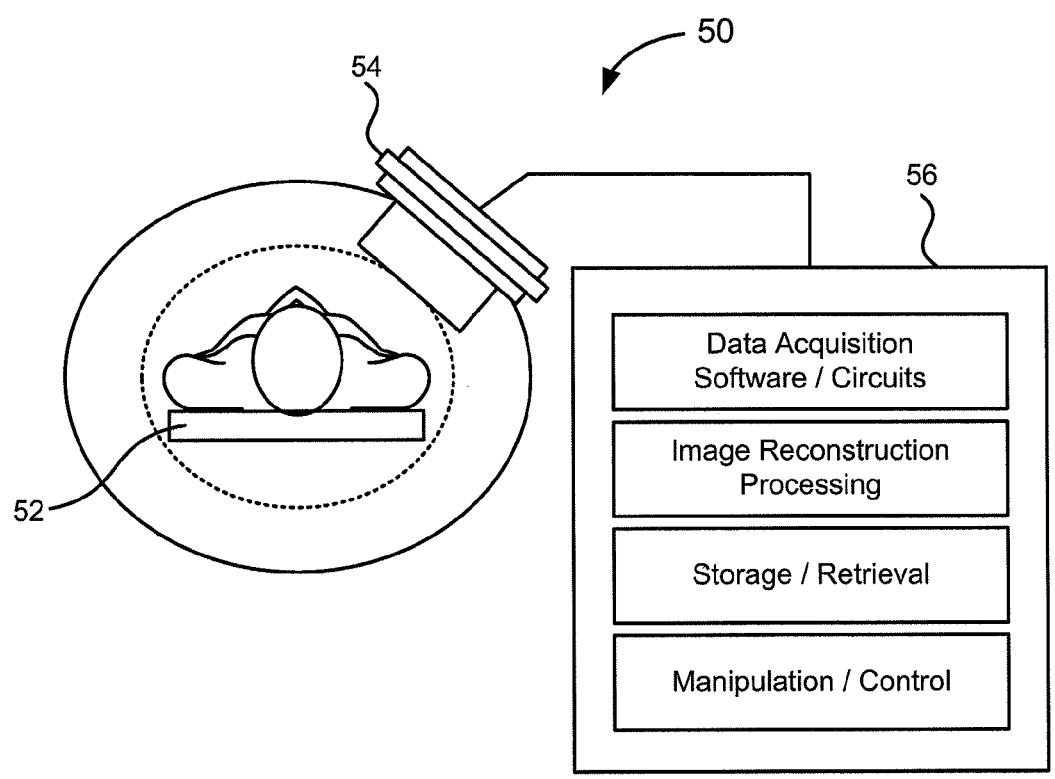
FIG. 7 illustrates a diagram of a single photon emission computed tomography (SPECT) imaging system.

FIG. 7 illustrates a basic configuration of a SPECT imaging system 50. The system 50 can include configurations/components commonly employed in known SPECT systems. As shown, the SPECT imaging system 50 includes a patient or subject area 52 (positioned subject shown for illustrative purposes), a detector assembly 54 and a computer control unit 56. The computer control unit 56 may include circuitry and software for data acquisition, image reconstruction and processing, data storage and retrieval, and manipulation and/or control of various components/aspects of the system. The detector assembly 54 can include a scintillator panel or area including a scintillator material and a photodetector assembly optically coupled to the scintillator material. The system can include a single gamma-camera or detector in the detector assembly or a plurality of detectors, with various configurations and arrangements being possible. The detector assembly 54 and subject area 52 may be movable with respect to each other, and may include moving the detector assembly 54 with respect to the subject area 52 and/or moving the subject area 52 with respect to the detector assembly 54. In use, radiation detection includes injecting or otherwise administering isotopes (including those commonly employed in SPECT imaging) having a relatively short half-life into the subject's body placeable within the subject area 52. The isotopes are taken up by the body and emit gamma-ray photons that are detected by the detector assembly 54. SPECT imaging is performed by using the detector assembly 54 to acquire multiple images or projections (e.g., 2-D images), from multiple angles. The computer control unit 56 is then used to apply image reconstruction and processing, e.g., using a tomographic reconstruction algorithm, to the multiple projections, yielding a 3-D dataset. This dataset may then be displayed as well as manipulated to show different views, including slices along any chosen axis of the body.

Light photodetector/imaging devices 14 including a pixel unit 20 and a signal division network 22 of the present invention can be utilized in the SPECT imaging system 50 and associated imaging methods. For example, the light photodetector/imaging devices 14 of the present invention can be incorporated into the detector assembly 54. A signal processing device 24 of the present invention can also be utilized in the SPECT imaging system 50 and associated imaging methods. For example, the signal processing devices 24 of the present invention can be incorporated into either the detector assembly 54 or the computer control unit 56.

Figure 8A:
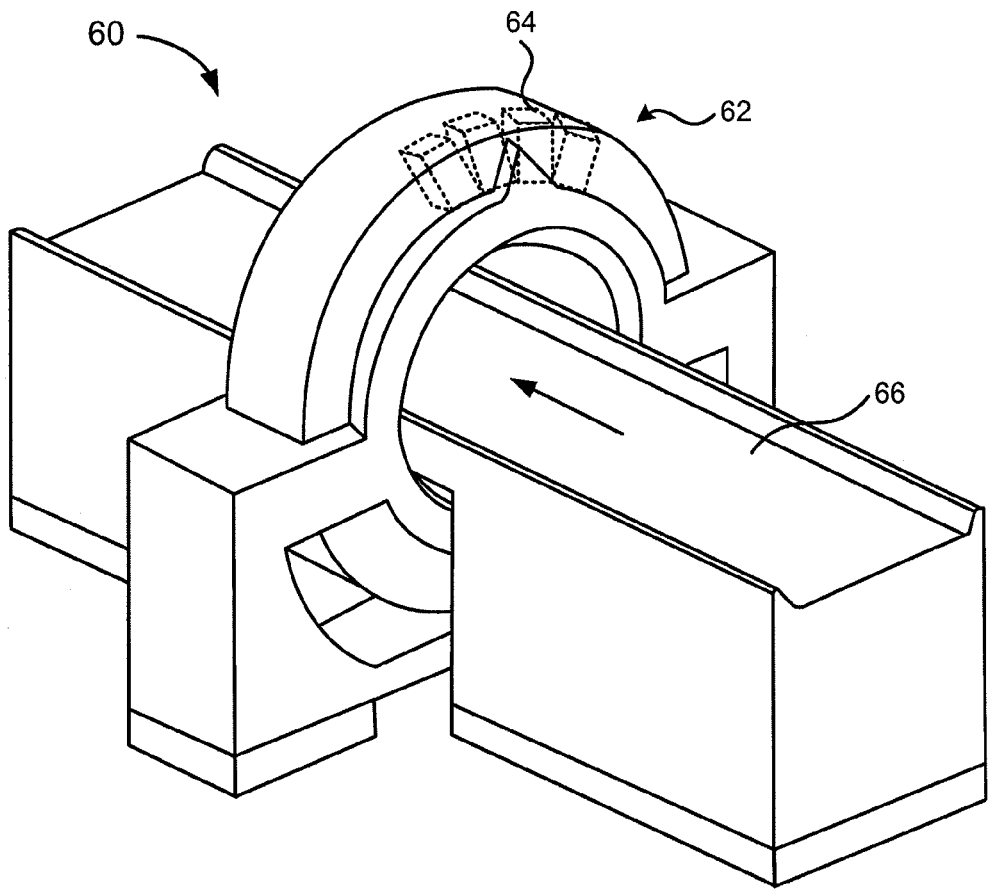
FIG. 8A illustrates a diagram of a PET imaging system.

FIG. 8A illustrates a basic configuration of a PET imaging system 60. In PET imaging, the PET imaging system 60 detects pairs of gamma rays emitted indirectly by a positron-emitting radionuclide (tracer), which is introduced into the subject's body. Images of tracer concentration in 3-dimensional space within the body are then reconstructed by computer analysis. PET imaging systems and aspects of time of flight (TOF) PET imaging are further described in commonly owned U.S. Pat. No. 7,504,634, which is incorporated herein by reference in its entirety for all purposes.

The PET imaging system 60 includes a PET camera system 62 having an array of radiation detectors 64, which may be arranged (e.g., in polygonal or circular ring) around a patient area 66. In some embodiments radiation detection begins by injecting or otherwise administering isotopes with short half-lives into a patient's body placeable within the patient area 66. As noted above, the isotopes are taken up by target areas within the body, the isotope emitting positrons that are detected when they generate paired coincident gamma-rays. The annihilation gamma-rays move in opposite directions, leave the body and strike the ring of radiation detectors 64.

Figure 8B:
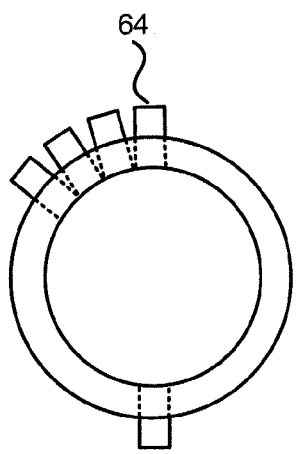
FIG. 8B illustrates an array of detectors for a PET imaging system.

As shown in FIG. 8B, the array of detectors 64 includes an inner ring of scintillators, including compositions as previously described herein, and an attached ring of light detectors or photomultiplier tubes. The scintillators respond to the incidence of gamma rays by emitting a flash of light (scintillation) that is then converted into electronic signals by a corresponding adjacent photomultiplier tube or light detectors. A computer control unit or system (not shown) records the location of each flash and then plots the source of radiation within the patient's body. The data arising from this process is usefully translated into a PET scan image such as on a PET camera monitor by means known to those having ordinary skill in the art.

Light photodetector/imaging devices 14 including a pixel unit 20 and a signal division network 22 of the present invention can be utilized in the PET imaging system 60 and associated imaging methods. For example, the light photodetector/imaging devices 14 of the present invention can be incorporated into the array of radiation detectors 64. A signal processing device 24 of the present invention can also be utilized in the PET imaging system 60 and associated imaging methods. For example, the signal processing devices 24 of the present invention can be incorporated into either the array of radiation detectors 64 or the computer control unit or system (not shown).

In addition to gamma-ray imaging applications such as SPECT and PET, many, indeed most, ionizing radiation applications will benefit from the inventions disclosed herein. Specific mention is made to X-ray fluoroscopy, X-ray cameras (such as for security uses), and the like.

Figure 9A:
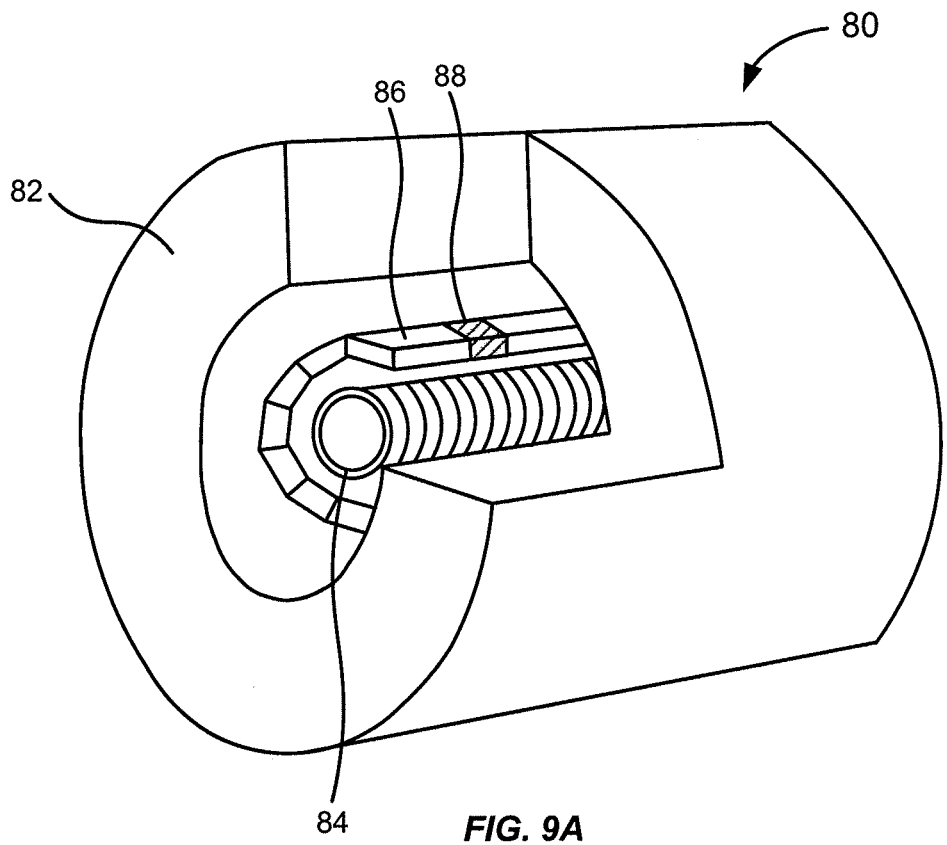
FIG. 9A illustrates a diagram of a combined PET/MRI imaging system.
Figure 9B:
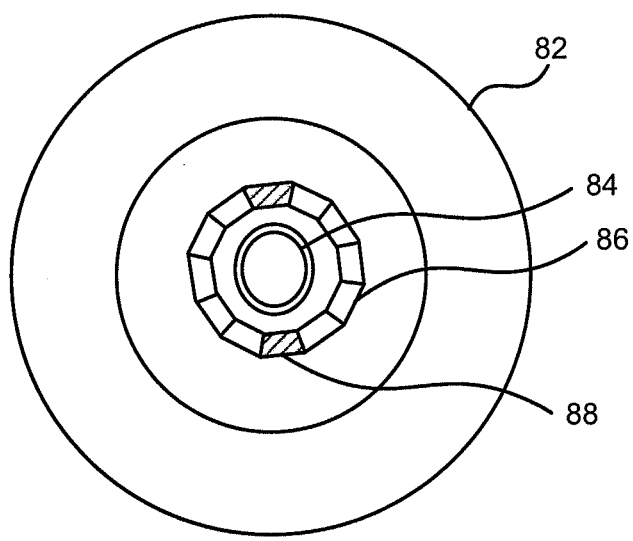
FIG. 9B illustrates a cross section of a combined PET/MRI imaging system.

FIG. 9A illustrates a basic configuration of a combined PET/MRI scanning system 80, and FIG. 9B illustrates a cross section of the combined PET/MRI scanning system 80. The system 80 can include configuration/components commonly employed in PET and MRI systems and used simultaneously (e.g., simultaneous dynamic MRI, simultaneous flow MRI, etc.) and further include a solid state photomultiplier device of the present invention. As shown, the PET/MRI scanning system 80 comprises an MRI scanner including a main magnet 82 that has a hollow cylindrical geometry. The main magnet 82 may embody the shape of a hollow cylinder. The main magnet 82 generates a strong and uniform magnetic. Due to the properties of the magnetic field, an MR image is typically acquired within a central region of the main magnet 82. The MRI scanner also includes a set of radio-frequency (RF) coils 84 typically located within the central region. The RF coils 84 may transmit RF signals to and receive RF signals from a subject during an MR imaging process, where the subject is also typically located in the central region.

The PET/MRI scanning system 80 also comprises a PET scanner 86 generally located within the hollow cylindrical shell of the main magnet 82. The PET scanner 86 generally has a hollow cylindrical geometry within which the RF coils 84 and subject are located. The PET scanner 86 includes one or more detector assemblies 88 and associated processing electronics, and a computer control system (not shown) which may include circuitry and software for image reconstruction, display, manipulation, post-acquisition calculations, storage, data output, receipt, and retrieval. The detector assemblies 88 may be provided in one or more rings around the RF coils 84. Each ring may generate one slice of a PET image for a subject. Hence, multiple rings may simultaneously generate multiple slices of PET images for a subject. More specifically, each ring of detector assemblies 88 collects high energy (e.g., 511 keV) annihilation photons produced by positron-electron annihilations, wherein the positrons are emitted within the slice of subject which is enclosed by the ring of scintillators. Next, each of the high-energy photons that are collected by the scintillators interacts with the scintillators to produce several hundreds to thousands of low energy photons in the form of UV or visible light photons which may subsequently be detected and displayed as an image.

The detector assembly 88 can include a scintillator panel or area including a scintillator material and a photodetector assembly optically coupled to the scintillator material. The system further includes (not shown) electronics coupled to the detector assembly 88 so as to output image data in response to radiation detection by the scintillator.

Although not shown in FIG. 9A or FIG. 9B, the PET/MRI scanning system 80 also includes a set of gradient coils which generates field gradients onto the main magnetic field in the x, y, and z directions. The field gradients are used to encode the distance information in the space where the subject is located. In one embodiment, the set of gradient coils is situated so that they enclose the PET scanner 86. Generally, a PET/MRI scanning system 80 is constructed so that the PET scanner 86 is inserted in the open space between the inner surface of main magnet 82 and RF coils 84.

Light photodetector/imaging devices 14 including a pixel unit 20 and a signal division network 22 of the present invention can be utilized in the combined PET/MRI scanning system 80 and associated imaging methods. For example, the light photodetector/imaging devices 14 of the present invention can be incorporated into the detector assembly 88. A signal processing device 24 of the present invention can also be utilized in the combined PET/MRI scanning system 80 and associated imaging methods. For example, the signal processing devices 24 of the present invention can be incorporated into either the detector assembly 88 or the computer control system (not shown). Incorporating light photodetector/imaging devices 14 and signal processing devices 24 according to the present invention in combined PET/MRI scanning systems 80 is particularly advantageous since the solid state photodiodes have a low sensitivity to magnetic fields and thus a PET imaging system can be incorporated into an MRI scanning system without detrimentally affecting an operation of the MRI scanning system.

Systems and methods of the present invention as described above are illustrative, and alternate configurations and embodiments will be included. The present invention may include modifications as well as combinations of imaging systems as described, such as combined imaging systems— e.g., combined SPECT MRI systems, and the like.

EXAMPLES

A. CMOS Position Sensitive SSPM

In one embodiment, "p on n" position sensitive solid state photomultipliers (PS-SPMs) using a high-voltage 0.8 μm CMOS process were developed, which were available through Metal Oxide Semiconductor Implementation Service (MOSIS). MOSIS is a relatively low cost production service for semiconductor development, which is well suited for small volume prototyping and production runs. The PS-SSPM had five output signals associated with it. There were four output signals that provide X-Y spatial information when compared amongst each other using Anger logic, and a PS-SSPM global signal, which is approximately the sum of the four spatial signals. The global signal can provide energy and timing information. Each individual micro-pixel discharge output was connected to a resistive network, where the total PS-SSPM current signal was shared amongst four electrodes located at the network corners, or end points. Depending on where the firing micro-pixels are, relative to the four electrode locations in the resistive network, the micro-pixel's current signal will be distributed over the network and its amplitude, measured at the electrodes, will be proportional to the firing micro-pixel location. By analyzing the four signals using Anger logic, the X and Y position can be calculated. So with this signal processing technique, it is possible to generate an image using a finely segmented scintillator array coupled to the PS-SSPM or some other incident focused light source. According to the basic PS-SSPM concept, micro-pixels are connected via a resistive network, and the signal charge is collected from the network corners. Anger logic according to an embodiment uses the peak amplitude from the four outputs to provide spatial information on an event-by-event basis. In one embodiment, four different PS-SSPM designs were provided, each with a different resistor network scheme, along with different micro-pixel geometries. Each PS-SSPM design used passive quenching to terminate the micro-pixel Geiger discharge. Table 1 lists the micro-pixel parameters for each PS-SSPM. One of the PS-SSPM designs, quadrant 2 (Q2), failed to produce any meaningful data due to issues believed to be related to its network resistors. Despite their resistor network differences, the PS-SSPMs all basically use the same readout technique, as described above, to determine the event X-Y location. The different resistor network designs for quadrant 1 (Q1), quadrant 3 (Q3), and quadrant 4 (Q4) are described in forthcoming sections.

TABLE 1

Parameters for four PS-SSPMs.
PS-SSPM Quadrant Parameters

| Parameter | Q1 | Q2 | Q3 | Q4 |
|---|---|---|---|---|
| Number of micro-pixels | 1089 | 900 | 255 | 900 |
| micro-pixel dimensions | 30 × 30 μm² | 30 × 30 μm² | 67 μm × 38 μm | 30 × 30 μm² |
| micro-pixel pitch dimensions | 44 × 44 μm² | 49 × 49 μm² | 93 × 93 μm² | 47 × 47 μm² |
| Fill Factor | 46% | 37% | 29% | 41% |

Figure 10A:
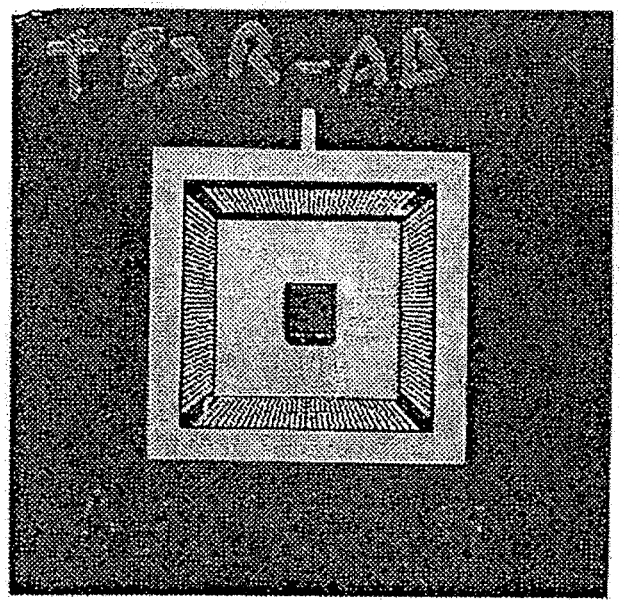
FIG. 10A shows a picture of a packaged a position sensitive SSPM (PS-SSPM) chip.
Figure 10B:
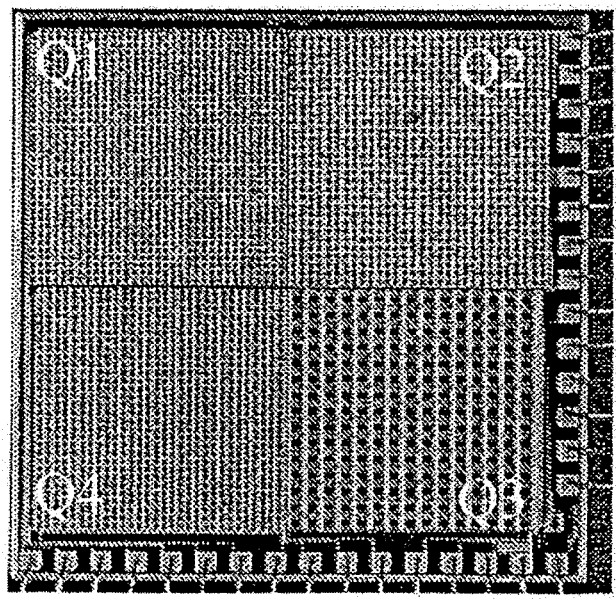
FIG. 10B shows an enlarged view of a four-quadrant PS-SSPM chip.

The four 1.5×1.5 mm² PS-SSPM variations were all fabricated on one 3×3 mm² chip, where each PS-SSPM could be independently operated and read out. The PS-SSPM chip was packaged on a ceramic 145 pin grid array (PGA). FIG. 10A illustrates the packaged PS-SSPM chip. FIG. 10B provides an enlarged view of the PS-SSPMs provided in each of the four quadrants.

A custom printed circuit board, with a mounted ZIF socket for the PGA, was fabricated in order to easily operate and readout the PS-SSPMs. The printed circuit board had a four-position switch to select which PS-SSPM had its output signals routed into the on-board charge sensitive preamplifiers.

Quadrant 1

The PS-SSPM fabricated at Q1 comprised a photodetector 14 and portions of a signal processing device 24 as illustrated in FIG. 4A and FIG. 4B. Each micro-pixel in Q1 is passively quenched with a 200 kΩ resistor and had its Geiger discharge injected into a resistor grid network. This network connects each micro-pixel output with its neighbors' output via 2 kΩ resistors. Four electrodes, each located at the network corners, collect the distributed charge so that charge sensing preamplifiers can then produce the spatial output signals for the PS-SSPM. The X and Y position for each event can be calculated using the shaped preamplifier outputs and equation (1). There is also a charge sensing preamplifier AC coupled to the PS-SSPM bias. This preamplifier produces the global PS-SSPM signal that can be used for energy and timing information.

Quadrant 3

The PS-SSPM fabricated at Q3 comprised a photodetector 14 and portions of a signal processing device 24 as illustrated in FIG. 5A and FIG. 5B. Like Q1, each micro-pixel in this design also had a 200 kΩ resistor to passively quench the Geiger discharge. At the output of each micro-pixel, are two field effect transistors (FETs). A +3 V drain voltage was applied to both FETs. The respective FET output was fed into a single row or column of resistors whose ends have charge sensing preamplifiers connected. The location along the row and column where the Geiger discharge is inserted provides the X and Y position information using equation (2). Q3 also has a global signal that was taken from the bias connection via an AC coupled charge sensing preamplifier.

Quadrant 4

The PS-SSPM fabricated at Q4 comprised a photodetector 14 and portions of a signal processing device 24 as illustrated in FIG. 6A and FIG. 6B. The micro-pixel readout design in Q4 was much like that of Q3, with the exception of the two FETs used at the micro-pixel output. In this case, each micro-pixel simply has two outputs for its Geiger discharge, each path possessing a 200 kΩ resistor for passive quenching. Again, each respective micro-pixel output is fed into a single row and column of resistors whose ends have connected charge sensing preamplifiers. Where along the row of column the current Geiger discharge is inserted, will provide the X and Y position information using equation (2). This PS-SSPM also has a global signal.

Quadrant One and Quadrant Four PS-SSPM Characterizations

Energy Resolution Using LYSO

Figure 11:
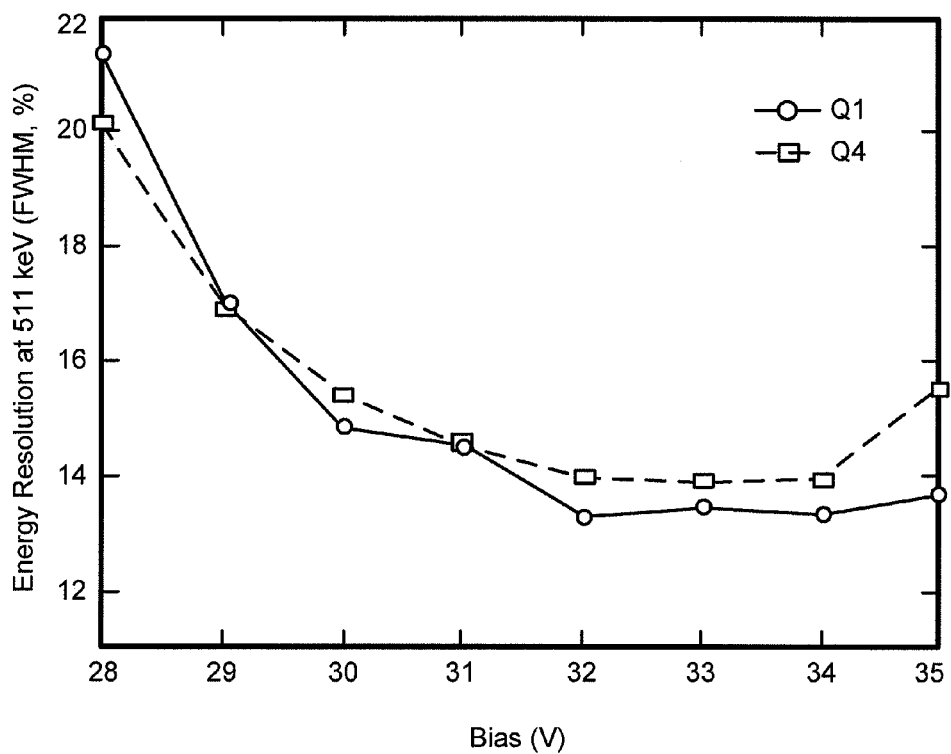
FIG. 11 shows the energy resolution at a varying bias voltage for Q1 and Q4 PS-SSPMs.

According to an embodiment, the energy resolution for Q1 and Q4 was measured at 511 keV using a 1×1×20 mm$^3$ LYSO scintillator wrapped with several layers of Teflon tape. The scintillator was coupled to each quadrant individually using optical grease (Rexon, RX-688) and irradiated with $^{22}$Na (511 keV). The global signal was used from each of the quadrants to record the pulse height distribution. The global signal was fed into a charge sensitive preamplifier and then shaped at 0.25 μsec using a spectroscopy amplifier (Canberra, model 2020). An MCA (Amptek, MCA-8000A) recorded and histogrammed the shaped signals for analysis. The energy resolution (at 511 keV) for each quadrant was measured in this way as the PS-SSPM bias was increased in 1 V increments from 28 V to 35 V. Breakdown occurs at 27 V for all quadrants. FIG. 11 shows the results. The energy resolution for Q1 and Q4 were approximately equal from 27 V to 34 V. At 34 V the FWHM energy resolution was 13.3% and 13.9% for Q1 and Q4 respectively.

Coincidence Timing Resolution Using LYSO

Figure 12A:
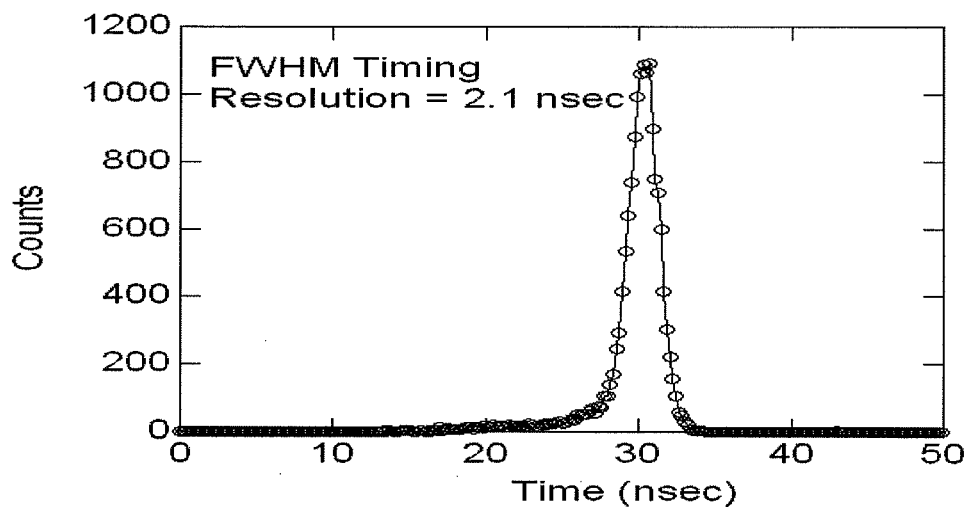
FIG. 12A shows the timing distribution and resolution for a Q1 PS-SSPM.
Figure 12B:
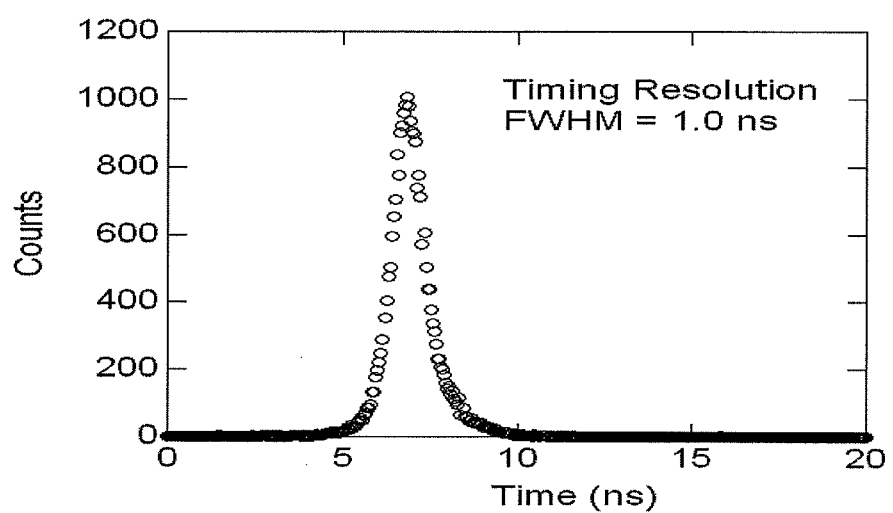
FIG. 12B shows the timing distribution and resolution for a Q4 PS-SSPM.

Using the same 1×1×20 mm$^3$ LYSO scintillator, the coincidence timing resolution was measured at 511 keV ($^{22}$Na) for the Q1 and Q4 quadrants compared with a PMT (Hamamatsu, H6533) coupled to a LYSO scintillator. A Canberra model 2003T preamplifier, which has a fast timing output, was AC coupled to the PS-SSPM global signal. Standard NIM electronics were used to perform the timing measurement. The LYSO-PMT provided the timing analyzer start signal, while the LYSO-SSPM provided the stop signal. Using this setup, the coincidence timing resolution was measured for each of the quadrants. The FWHM timing resolution for Q1 at 32 V was 2.1 nsec and Q4 at 32 V was 1.0 nsec. No energy gating was used. FIG. 12A and FIG. 12B show the timing distribution and resolution for Q1 and Q4, respectively.

Laser Based Spatial Resolution

Figure 13A:
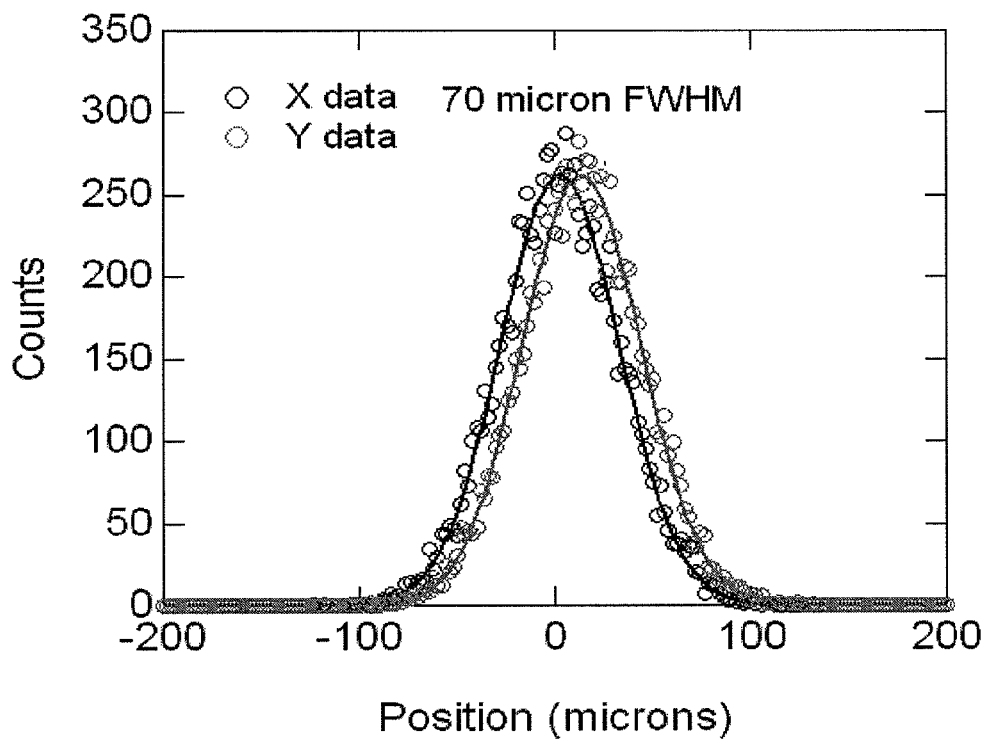
FIG. 13A shows the spatial resolution for a Q1 PS-SSPM.
Figure 13B:
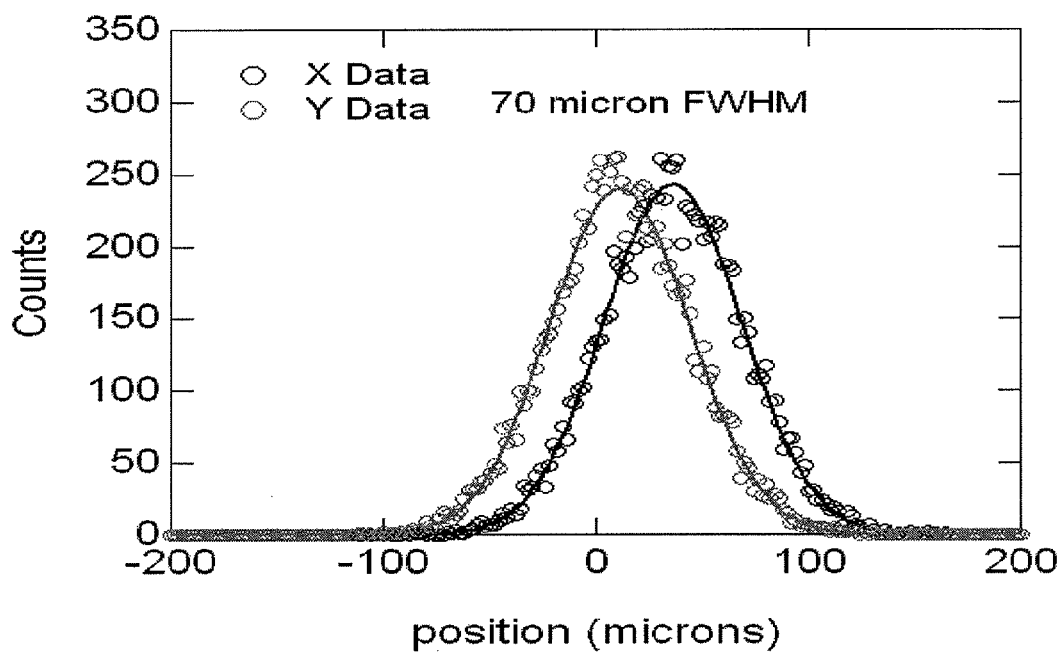
FIG. 13B shows the spatial resolution for a Q4 PS-SSPM.

According to an embodiment, the intrinsic spatial resolution of Q1 and Q4 was measured using a pulsed 635 nm diode laser (Thorlabs, HS9-635), driven by a pulse generator (Tektronix PG508), focused into an approximately 15 μm diameter beam spot that was incident upon the middle of the quadrant's sensing area. The laser intensity was approximately 1000 photons/pulse, with a pulse width of 50 nsec at a frequency of approximately 1 kHz. For each laser pulse, the four spatial output signals were shaped at 0.25 μsec by Canberra amplifiers (model 2020) and then sent to a sample and hold circuit before being readout and digitized by our data acquisition card (Keithley, DAS-1802HC). The X-Y position was calculated for each event using equation (1) or (2) (depending on which quadrant was being examined) and recorded in list-mode. Ten thousand pulses were recorded by each quadrant and the calculated X-Y positions were histogrammed. The histogrammed position distribution FWHM defined the spatial resolution. FIG. 13A and FIG. 13B show the spatial resolution for Q1 and Q4, respectively. The measured X-Y spatial resolution for Q1 and Q4 at 28 V bias were both approximately 70 μm.

Scintillator Array Imaging

Figure 14:
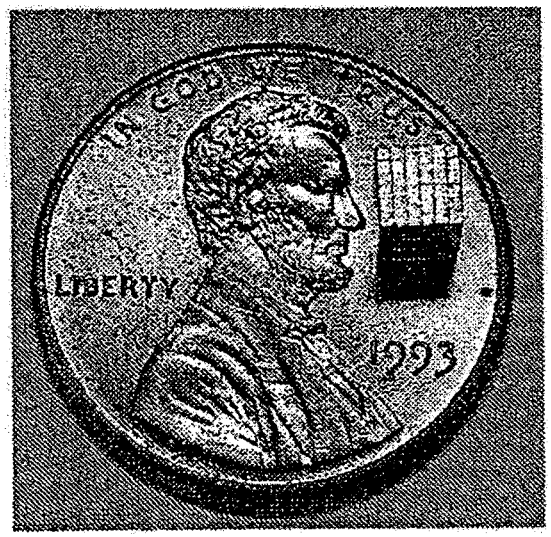
FIG. 14 shows a picture of a LYSO scintillator array.
Figure 15A:
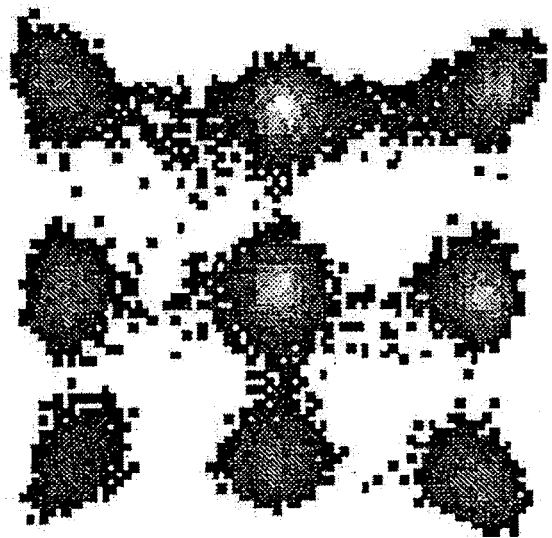
FIG. 15A shows an image produced by a Q1 PS-SSPM.
Figure 15B:
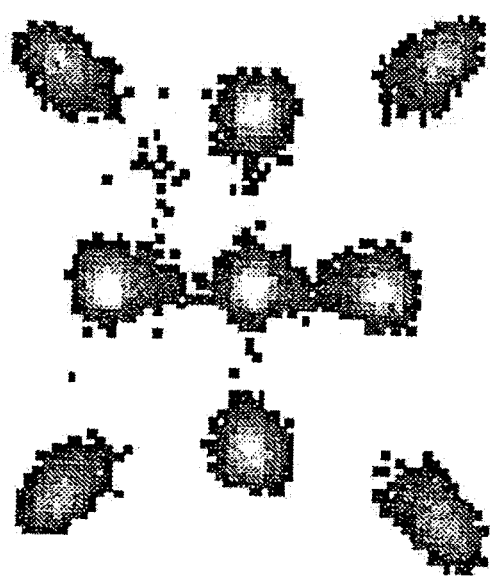
FIG. 15B shows an image produced by a Q4 PS-SSPM.

According to an embodiment, imaging studies were performed using a LYSO scintillator array. The LYSO array is illustrated in FIG. 14 and was populated with 500×500 μm$^2$ pixels. The array was coupled to the quadrants individually using optical grease from Rexon. The array was larger than the quadrant sensing area; however, for a simple imaging demonstration this was not a concern. The detector and LYSO array were uniformly irradiated with 511 keV gamma-rays from $^{22}$Na. The four PS-SSPM output signals were processed in the same fashion as for the spatial resolution measurements. Here, the data acquisition was triggered by the PS-SSPM global signal. Given the 1.5×1.5 mm$^2$ area for each quadrant and the pixel dimensions, a 3×3 image is the largest one can achieve. FIG. 15A and FIG. 15B show the array images produced by Q1 and Q4, respectively. The LYSO array image for Q1 shows a pincushion distortion, which is typical for similar imaging sensors or systems that use Anger logic, such as equation (1), to build an image. Note that Q4, which does not use a resistive grid network, but rather uses a resistive row-column readout, does not show a distortion.

B. LYSO-SSPM PET Detector for Combined PET/MRI Applications

According to an embodiment, a novel solid SSPM was designed using standard CMOS technology and evaluated the SSPM for combined PET/MRI systems.

CMOS SSPMs

Figure 16A:
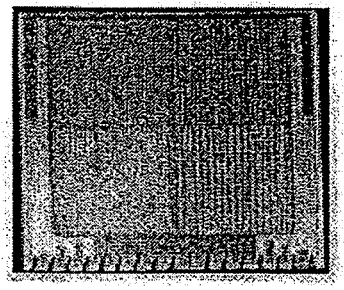
FIG. 16A shows a picture of a four-quadrant SSPM chip, where each quadrant has an SSPM with unique design parameters.
Figure 16B:
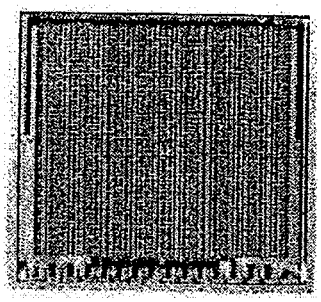
FIG. 16B shows a picture of a four-quadrant SSPM chip, where all quadrants have the same design parameters.

According to an embodiment, high fill factor 2×2 arrays of SSPMs were built with each SSPM measuring 1.5×1.5 mm$^2$. The design details for these SSPMs are provided in Table 2. FIG. 16A shows a chip that has four separate SSPMs, each with 1.5×1.5 mm$^2$ area but with different design parameters. In other words, each SSPM in a quadrant has unique design parameters. These SSPMs have square micro-pixels (30-50 μm size). FIG. 16B shows a chip that also has four separate SSPMs, each with 1.5×1.5 mm$^2$ area but in this case each quadrant has an identical design and as a result the whole chip can be operated as a single 3×3 mm$^2$ SSPM with ~1750 pixels.

TABLE 2

Parameters for CMOS SSPMs.
CMOS SSPM Parameters

| Active Area (mm$^2$) | micro-pixel Size (μm)/micro-pixel Pitch (μm) | # of micro-pixels | Fill Factor | Gain | Operating Bias |
|---|---|---|---|---|---|
| 1.5 × 1.5 | 30/56 (square) | 576 | 29% | 1 × 10$^6$ | 30 V |
| 1.5 × 1.5 | 30/43 (square) | 961 | 49% | 1 × 10$^6$ | 30 V |

TABLE 2-continued

Parameters for CMOS SSPMs.

| CMOS SSPM Parameters | | | | | |
|---|---|---|---|---|---|
| Active Area (mm$^2$) | micro-pixel Size (μm)/micro-pixel Pitch (μm) | # of micro-pixels | Fill Factor | Gain | Operating Bias |
| 1.5 × 1.5 | 50/76 (square) | 324 | 43% | 3.5 × 10$^6$ | 30 V |
| 1.5 × 1.5 | 50/63 (square) | 441 | 63% | 3.5 × 10$^6$ | 30 V |
| 3 × 3 | 50/63 (square) | ~1750 | 63% | 3.5 × 10$^6$ | 30 V |

Evaluation of LYSO-SSPM Detector for PET/MRI Studies

Figure 17:
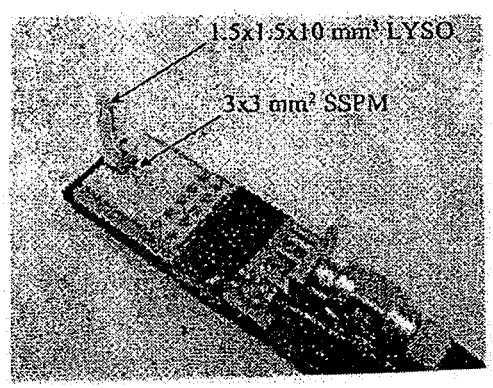
FIG. 17 shows a picture of an SSPM mounted on a substrate.
Figure 18:
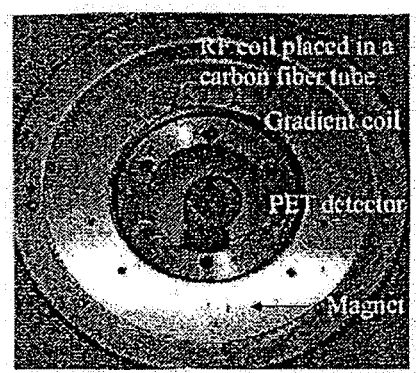
FIG. 18 shows a picture of an MRI system with an inserted lutetium yttrium oxyorthosilicate (LYSO) SSPM PET detector.

According to an embodiment, a PET detector was built, consisting of a 1.5×1.5×10 mm$^3$ LYSO crystal, coupled with optical grease to a 1.5×1.5 mm$^2$ SSPM with 49% fill-factor (described in the second row of Table 1). The SSPM was mounted on a ceramic substrate and then placed on a 15×25 mm readout board. The readout board was made with non-magnetic material and was finally mounted on a 45 cm long carbon fiber strip as shown in FIG. 17. The detector was positioned in the annulus between the RF and the gradient coils of UC Davis' 7T Bruker Biospec MRI system, exactly where it would need to be for simultaneous PET and MRI studies. FIG. 18 is a photograph of an MRI system with an inserted LYSO-SSPM PET detector.

Effect of MRI on a LYSO-SSPM PET Detector

Figure 19C:
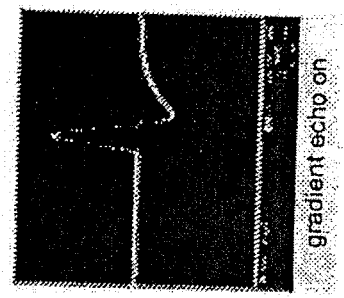
FIG. 19C shows a picture of a single event pulse output from a PET detector arranged inside a magnetic field of an MRI system with a standard gradient echo sequence running.
Figure 19B:
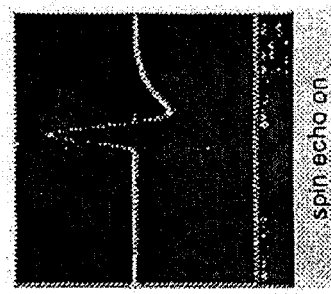
FIG. 19B shows a picture of a single event pulse output from a PET detector arranged inside a magnetic field of an MRI system with a standard spin echo running.
Figure 19A:
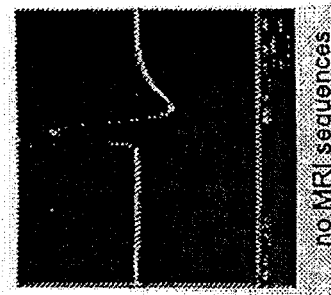
FIG. 19A shows a picture of a single event pulse output from a PET detector arranged inside a magnetic field of an MRI system with no MRI sequences.

According to an embodiment, a $^{68}$Ge gamma source was placed in the cavity of the RF coil and at the center of the field of view of an MRI system. The PET detector, as illustrated in FIG. 18, was biased at 30V. FIG. 19A, FIG. 19B, and FIG. 19C show single event pulses from the output of the amplifier, digitized using a fast oscilloscope when the detector was inside the magnetic field (without any MRI sequences), when a standard spin echo was running, and when a standard gradient echo sequence was running, respectively. The PET signals were not distorted, nor was there a visible baseline shift or increased noise.

Figure 20:
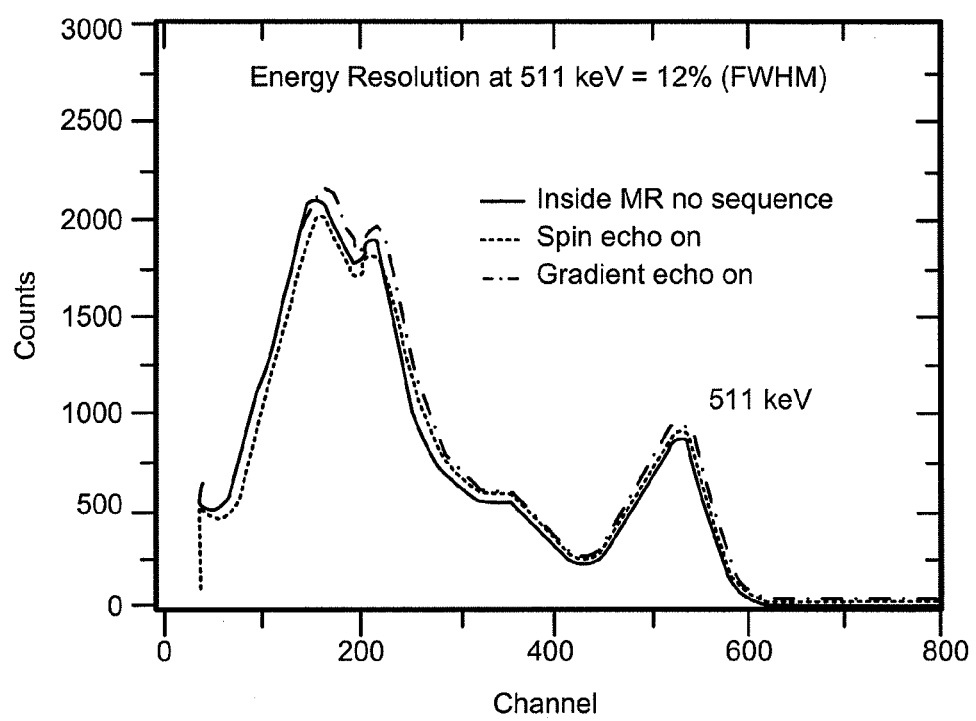
FIG. 20 shows energy spectra from a PET detector arranged inside a magnetic field of an MRI system.

FIG. 20 shows energy spectra recorded when the detector was inside the magnet without any sequence and with spin echo and gradient echo sequences on. A slight change (less than 2%) in the location of the 511 keV photopeak was observed with and without MRI sequences. The measured energy resolution was ~12% (FWHM) with and without MRI sequences, suggesting that there was no significant loss in signal amplitude or increase in noise.

Effect of LYSO-SSPM PET Detector On MRI Images

According to an embodiment, a structured cylindrical MRI phantom containing Magnevist® in water was imaged to assess the effect of the PET insert on the MRI data acquisition. FIG. 21A shows MRI images acquired without a PET detector. In the top image a spin sequence was on, and in the bottom image a gradient echo sequence was on. FIG. 21B shows MRI images acquired where a PET detector was included in the MRI system and the PET detector was turned off. In the top image a spin sequence was on, and in the bottom image a gradient echo sequence was on. FIG. 21C shows MRI images acquired where a PET detector was included in the MRI system and the PET detector was powered on. In the top image a spin sequence was on, and in the bottom image a gradient echo sequence was on.

The images were visually inspected for the presence of artifacts. No obvious artifacts can be observed in the resulting phantom images when compared with the ones acquired without the PET detector insert. This suggests that there was no significant interference due to the PET detector on the magnetic field or RF pulses of the MRI scanner. This investigation shows promise for MR-compatible PET systems based on SSPM technology.

Although the invention has been described with reference to the above examples, it will be understood that modifications and variations are encompassed within the spirit and scope of the invention. Accordingly, the invention is limited only by the following claims along with their full scope of equivalents.

What is claimed is:

1. An integrated silicon solid state photomultiplier (SSPM) device operable in a Geiger mode, the device comprising:
a pixel unit including an array of more than 2×2 p-n micro-pixels on a common substrate;
a signal division network electrically coupled to each micro-pixel, the signal division network including four output connections each for providing an output signal;
a signal output measurement unit configured to measure the output signal from each output connection;
a processing unit configured to process the output signals so as to identify the micro-pixel generating a signal or a center of mass of micro-pixels generating a signal, and
a global signal receiving unit comprising a preamplifier electrically coupled in series with a capacitor, wherein the capacitor is electrically coupled to the micro-pixels,
wherein the signal division network further includes a plurality of resistive elements; the micro-pixels are arranged in a plurality of rows and columns; the micro-pixels arranged in the same row are coupled in parallel with one another; the micro-pixels arranged in the same column are coupled in parallel with one another; one of the plurality of resistive elements is provided, for each row of micro-pixels, in series between the micro-pixels in the same row and the micro-pixels in an adjacent row; and one of the plurality of resistive elements is provided, for each column of micro-pixels, in series between the micro-pixels in the same column and the micro-pixels in an adjacent column.

2. The device of claim 1, wherein a drain voltage is applied to each micro-pixel.

3. The device of claim 2, wherein each micro-pixel further includes a pair of transistors, and a gate of each transistor is electrically coupled to the resistive element.

4. An integrated silicon solid state photomultiplier (SSPM) device operable in a Geiger mode, the device comprising:
a pixel unit including an array of more than 2×2 p-n micro-pixels on a common substrate;
a signal division network electrically coupled to each micro-pixel, the signal division network including four output connections each for providing an output signal;
a signal output measurement unit configured to measure the output signal from each output connection;
a processing unit configured to process the output signals so as to identify the micro-pixel generating a signal or a center of mass of micro-pixels generating a signal, and
a global signal receiving unit comprising a preamplifier electrically coupled in series with a capacitor, wherein the capacitor is electrically coupled to the micro-pixels,
wherein the signal division network further includes a plurality of resistive elements; the micro-pixels are arranged in a plurality of rows; the micro-pixels arranged in the same row are coupled in parallel with one another and each are coupled in parallel with one of the plurality of resistive elements; and one of the plurality of resistive elements is coupled in series between each pair of micro-pixels arranged in the same row.

5. The device of claim 4, wherein the signal output measurement unit includes a resistive element and a preamplifier electrically coupled to each of the four output connections.

6. A radiation detection system comprising:
   the integrated silicon solid state photomultiplier (SSPM) device of claim 4; and
   a scintillator optically coupled to the SSPM device.

7. The system of claim 6 wherein the scintillator comprises individual elements matched to the geometry of the integrated silicon SSPM.

8. The system of claim 6 wherein the scintillator comprises a pixellated microcolumnar scintillator.

9. The system of claim 6 wherein the scintillator comprises a substantially continuous scintillator.

10. A combined PET/MRI imaging system, comprising:
    a main magnet for use in MRI imaging;
    an RF coil disposed in the main magnet for use in MRI imaging; and
    a PET scanner disposed between the main magnet and the RF coil for use in PET imaging, the PET scanner comprising the integrated silicon solid state photomultiplier device of claim 4.

* * * * *